(12) United States Patent
Gopalakrishnan et al.

(10) Patent No.: US 7,385,234 B2
(45) Date of Patent: Jun. 10, 2008

(54) MEMORY AND LOGIC DEVICES USING ELECTRONICALLY SCANNABLE MULTIPLEXING DEVICES

(75) Inventors: Kailash Gopalakrishnan, Mountain View, CA (US); Hemantha Kumar Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 11/116,700

(22) Filed: Apr. 27, 2005

(65) Prior Publication Data

US 2006/0244047 A1   Nov. 2, 2006

(51) Int. Cl.
*H01L 29/86* (2006.01)

(52) U.S. Cl. ............... 257/213; 257/288; 257/E29.167; 257/E29.325

(58) Field of Classification Search ........ 257/E29.167, 257/E29.325
See application file for complete search history.

(56) References Cited

U.S. PATENT DOCUMENTS

| | | | |
|---|---|---|---|
| 4,812,886 | A | 3/1989 | Smith, III |
| 5,241,190 | A | 8/1993 | Eisenstein et al. |
| 5,627,395 | A | 5/1997 | Witek et al. |
| 6,180,975 | B1 | 1/2001 | Radens et al. |
| 6,222,788 | B1 | 4/2001 | Forbes et al. |
| 6,380,765 | B1 * | 4/2002 | Forbes et al. ............... 326/112 |
| 7,352,029 | B2 * | 4/2008 | Wickramasinghe et al. . 257/331 |
| 2003/0122180 | A1 | 7/2003 | Sugiyama et al. |
| 2004/0016950 | A1 | 1/2004 | Chindalore et al. |
| 2004/0152272 | A1 * | 8/2004 | Fladre et al. ............... 438/284 |
| 2004/0262690 | A1 * | 12/2004 | Coronel et al. ............. 257/365 |
| 2005/0059219 | A1 * | 3/2005 | Tayanaka .................... 438/458 |
| 2006/0244058 | A1 * | 11/2006 | Wickramasinghe et al. . 257/331 |

FOREIGN PATENT DOCUMENTS

| | | |
|---|---|---|
| JP | 3016477 A | 1/1991 |
| WO | WO 2004/090195 A1 * | 10/2004 |
| WO | WO 2004/090984 A1 * | 10/2004 |

OTHER PUBLICATIONS

C.G. Jamotkar, "Methods to Fabricate Very Dense Arrays of Dynamic RAM Cells," IBM Technical Disclosure Bulletin, vol. 24, No. 8, pp. 4239-4243, Jan. 1982.
Andre DeHon et al, "Nanowire-Based Sublithographic Programmable Logic Arrays," FPGA, Feb. 22-24, 2204.

* cited by examiner

*Primary Examiner*—Andy Huynh
*Assistant Examiner*—Hoang-Quan Ho
(74) *Attorney, Agent, or Firm*—Samuel A. Kassatly; Jon A. Gibbons; Fleit Kain Gibbons Gutman Bongini & Bianco P.L.

(57) ABSTRACT

A memory device or a logic device that uses an electronically scannable multiplexing device capable of addressing multiple bits within a volatile or non-volatile memory cell. The multiplexing device generates an electronically scannable conducting channel with two oppositely formed depletion regions. The depletion width of each depletion region is controlled by a voltage applied to a respective control gate at each end of the multiplexing device. The present multi-bit addressing technique allows, for example, 10 to 100 bits of data to be accessed or addressed at a single node. The present invention can also be used to build a programmable nanoscale logic array or for randomly accessing a nanoscale sensor array.

18 Claims, 31 Drawing Sheets

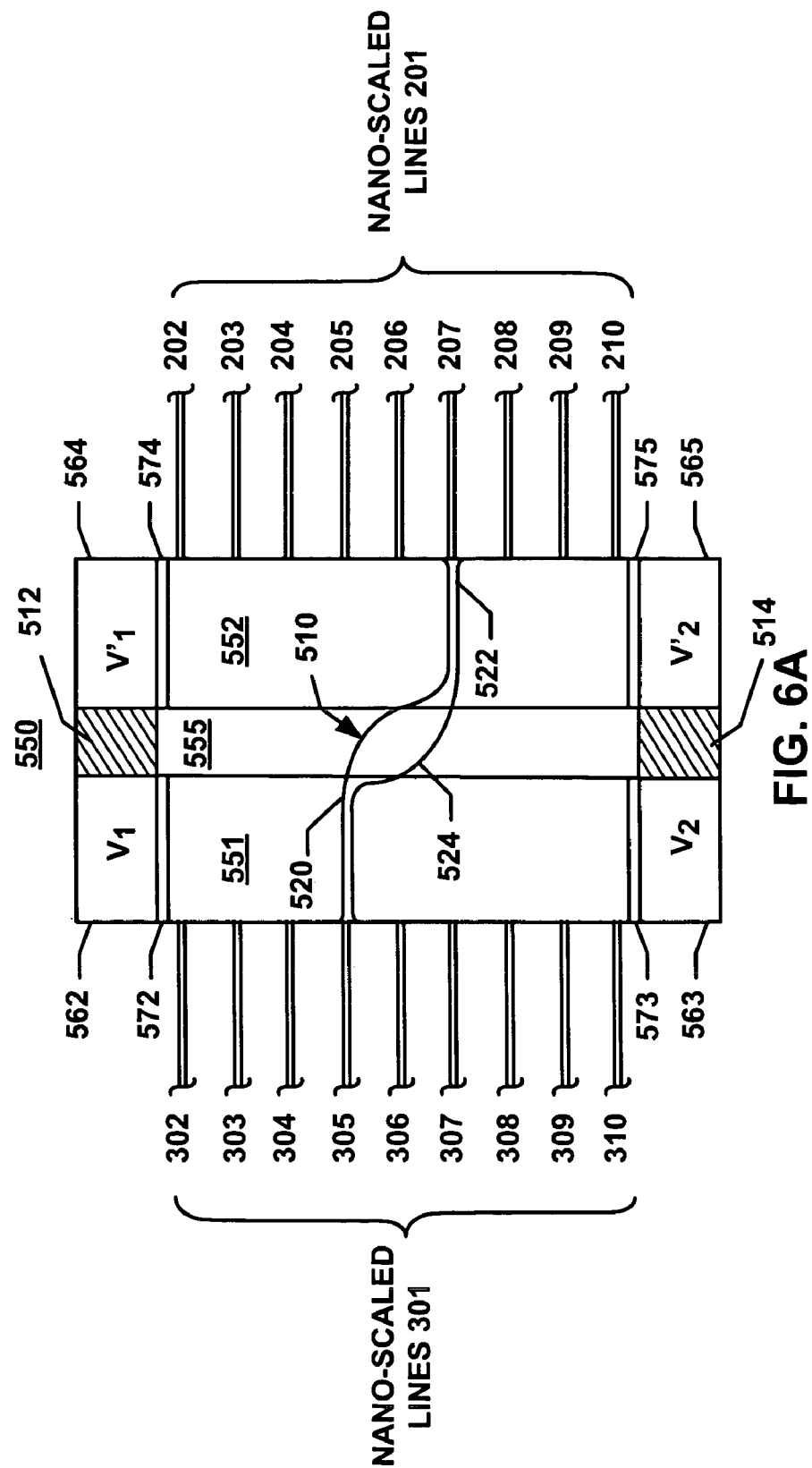

MEMORY AND LOGIC DEVICES USING ELECTRONICALLY SCANNABLE MULTIPLEXING DEVICES

FIELD OF THE INVENTION

The present invention generally relates to the field of semiconductor devices. More specifically, the present invention relates to memory devices, logic devices, sensors, and other similar addressable devices for use with semiconductor multiplexing devices that generate an electronically scannable conducting channel.

BACKGROUND OF THE INVENTION

Conventional memory devices are limited to mostly 1 bit at the intersection of a wordline (WL) and a bitline (BL) in a memory array. For example, DRAM devices are limited to 1 bit per intersection, which corresponds to the presence of only one capacitor at each node. Similarly, FLASH devices have at most 2 bits per cell, in a multibit or multilevel configuration. These 2 bits can be detected based on the magnitude and direction of the current flow across the cell.

However, conventional memory devices are not capable of easily accommodating more than two memory bits at every crosspoint intersection. It would therefore be desirable to expand the access capability in memory devices to select or read multiple bits at every memory area or crosspoint that is normally desired by one memory wordline and bitline.

One problem facing conventional semiconductor lithographic techniques is the ability to electrically interconnect nano-scaled lines or patterns (on the order of 1 nm to 100 nm) and micro-scaled lines or patterns (on the order of 90 nm or a feature that could be typically defined by semiconductor processes such as lithography). Such connection is not currently practical, as it requires a significant interconnect semiconductor area, which increases the cost and complexity of the manufacturing process or the final product.

It would therefore be desirable to have a multiplexing device or an addressing device that establishes selective contact to memory cells, logic devices, sensors, or between nano-scaled lines and micro-scaled lines within a minimal space, thus limiting the overall cost and complexity of the final product.

The need for such memory cells, logic devices, sensors, and other similar addressable devices has heretofore remained unsatisfied.

SUMMARY OF THE INVENTION

The present invention satisfies this need, and presents a multiplexing device for use with memory cells, logic devices, sensors, and other similar addressable devices. The multiplexing device is capable of selectively addressing multiple nodes or cross-points, such as multiple bits within a volatile or non-volatile memory cell. This multi-node addressing aspect of the present invention uses the fact that wordline and bitline voltages can be varied in a continuous fashion, to enable the selection or reading of multiple states at every crosspoint.

The present multi-node addressing technique allows, for example, 10 to 100 bits of data to be recorded at a single node, or in general to access bits of data that are of the order of 100 times more densely packed than conventional lithographically defined lines. As used herein, a node includes for example the intersection of a wordline and a bitline, such as a memory wordline and bitline.

The multiplexing devices selectively generates a thin, elongated, semiconducting (or conducting) channel (or window) at a desired location within a substrate, to enable control of the width of the channel, from a first conducting sea of electrons on one side of the substrate to a second conducting sea of electrons on the other side of the substrate.

In one embodiment, the multiplexing device generates an electronically scannable conducting channel with two oppositely formed depletion regions. The depletion width of each depletion region is controlled by a voltage (or potential) applied to a respective control gate at each end of the multiplexing device.

In another embodiment, the depletion width is controlled from one control gate only, allowing the access to the memory bits for both the reading and writing operations to be sequential. Other embodiments are also contemplated by the present invention.

If the depletion width is controlled at both ends of the multiplexing device, along the same axis, the conducting channel can be small (e.g., sub 10 nm) to enable random access to the memory bits. The present invention is applicable to random access memories, such as SRAM, DRAM, and FLASH, for embedded and standalone applications and to programmable logic arrays.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 6A is a schematic illustration of another embodiment of the multiplexing device of FIG. 6, illustrating two discrete depletable regions separated by a transition region therebetween;

DETAILED DESCRIPTION OF PREFERRED EMBODIMENTS

Figure 1:
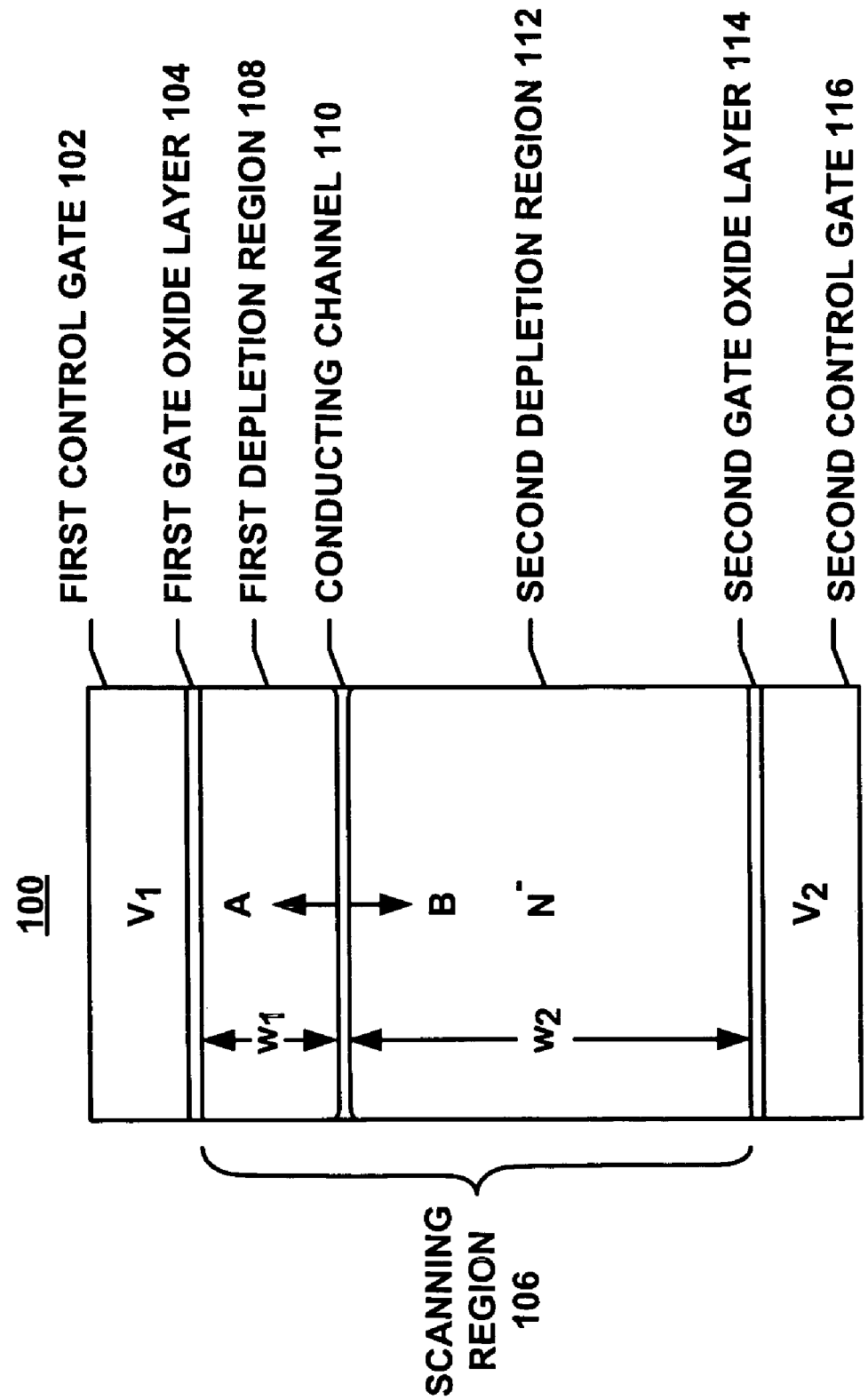
FIG. 1 is a schematic illustration of an exemplary multiplexing device of the present invention, comprising a scannable conducting channel having a relatively narrow width, shown in a first position within a scanning region.
Figure 2:
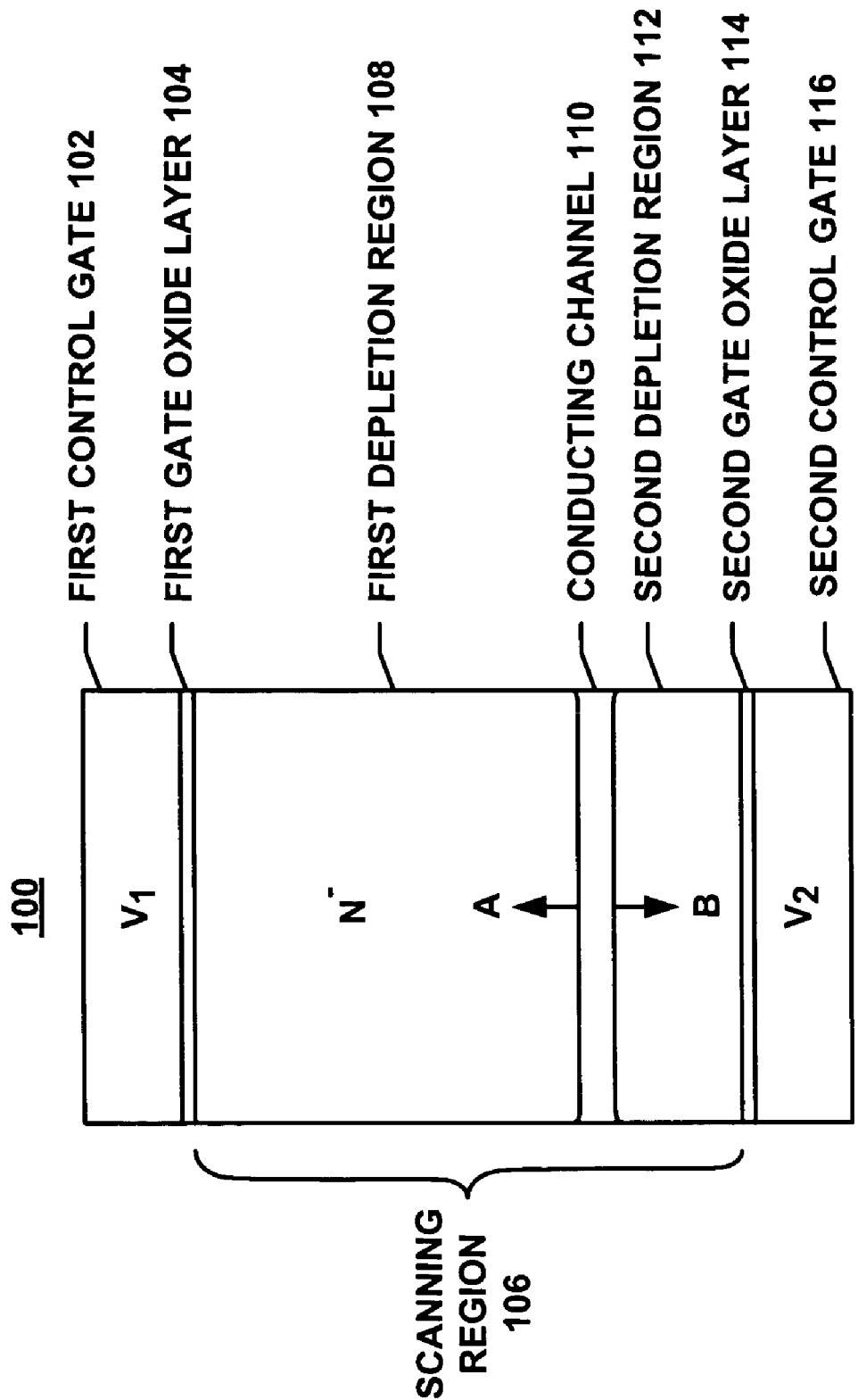
FIG. 2 is a schematic illustration of the multiplexing device of FIG. 1, showing the scannable conducting channel with a relatively wider width, in a second position within the scanning region.

FIGS. 1 and 2 illustrate an exemplary multiplexing device 100 of the present invention. The multiplexing device 100 comprises a conducting channel 110 that is controllably scannable within a scanning region 106. A first gate oxide layer 104 is disposed intermediate the scanning region 106 and a first control gate 102, at one end of the multiplexing device 100. At the opposite end of the multiplexing device 100, a second gate oxide layer 114 is disposed intermediate the scanning region 106 and a second control gate 116.

When suitably biased by a potential $V_1$, the first control gate 102 generates a first depletion region 108 in the scanning region 106. Similarly, when the second control gate 116 is suitably biased by a potential $V_2$, it generates a second depletion region 112 in the scanning region 106. The first and second depletion regions 108, 112 interact to generate the conducting channel 110.

The width $w_1$ of the first depletion region 108 is regulated by the potential $V_1$ and the doping concentration in the scanning region 106. Similarly, the width $w_2$ of the second depletion region 112 is regulated by the potential $V_2$ and the doping concentration in the scanning region 106. As a result, the width and the position of the conducting channel 110 can be very precisely controlled. FIGS. 1 and 2 illustrate the conducting channel 110 at two different positions along the scanning region 106, and having different widths.

In a structure that is suitable for the formation of multiplexing device 100, the first and second control gates 102 and 116, respectively, are formed of conductive layers. As used herein a conductive layer can be formed of any suitable conductive or semiconductive material. For example the conductive layer can be formed of copper, tungsten, aluminum, a silicided layer, a salicided layer, a semiconductive layer, or a conductive layer, such as metallic materials, polysilicon, silicon germanium, metallic composites, refractory metals, conductive composite materials, epitaxial regions, amorphous silicon, titanium nitride, or like conductive materials. Preferably, the conductive layers are formed of polysilicon layers that are doped with dopant atoms. Dopant atoms can be, for example, arsenic and/or phosphorus atoms for n-type material, or boron atoms for p-type material.

Although the first and second control gates 102 and 116 can be lithographically defined into two distinct sections that are oppositely disposed relative to the scanning region 106, as illustrated in FIG. 1, it should be clear that the first and second control gates 102 and 116 could be disposed at different positions relative to the scanning region 106. In particular, while the multiplexing device 100 is illustrated as having a generally rectangular shape, it should be clear that multiplexing device 100 could assume various other shapes, such as circular, oval, square, and various other shapes. Some of these alternative designs for the multiplexing device 100 could require the allocation of the first and second control gates 102 and 116 at various positions that are not necessarily opposite.

The two distinct sections of the first and second control gates 102 and 116 can be of a different conductivity type, for example: one section can be n-type while the other section can be p-type dopants or the two regions could have different metals. Known or available masking and ion implanting techniques can be used to alter the doping of portions of conductive layers.

The first and second control gates 102 and 116 can have the same or different widths. The width of each control gate can, for example, exceed 1000 angstroms. The voltages $V_1$ and $V_2$ applied to the first and second control gates 102 and 116, respectively, can vary between approximately 0 and +/−100 volts.

A dielectric first gate oxide layer 104 is formed intermediate the first control gate 102 and the scanning region 106. Similarly, a dielectric second gate oxide layer 114 is formed intermediate the second control gate 116 and the scanning region 106. As used herein a dielectric layer can be any insulator such as wet or dry silicon dioxide ($SiO_2$), hafnium oxide, silicon nitride, tetraethylorthosilicate (TEOS) based oxides, borophospho-silicate-glass (BPSG), phospho-silicate-glass (PSG), boro-silicate-glass (BSG), oxide-nitride-oxide (ONO), oxynitride materials, plasma enhanced silicon nitride (p-SiNx), a spin on glass (SOG), titanium oxide, or like dielectric materials or composite dielectric films with a high k gate dielectric. A preferred dielectric material is silicon dioxide.

The scanning region 106 can be formed of any suitable, depletable material. In this exemplary illustration, the scanning region 106 is formed of a depletion region, such as silicon or polysilicon layer that is lightly doped with either an n-type dopant, or a p-type dopant. In this exemplary embodiment, the scanning region 106 is doped with an n-type dopant. The width of the scanning region 106 could exceed 5 nm. The various components of regions and layers of the multiplexing devices described herein, could be made using, for example, known or available methods, such as, for example, lithographic processes.

In operation, by varying the voltages $V_1$ and $V_2$ on the first and second control gates 102, 116, respectively, the conducting channel 110 is controllably scanned along the directions of the scanning arrows A and B, up and down the central column of the multiplexing device 100. In the present exemplary embodiment, the width, w (e.g., w1, w2) of the depletion regions 108, 112 is determined by the following equation:

$$w=(2)^{1/2}\lambda_n(v_l)^{1/2}$$

where $\lambda_n$ is the extrinsic Debye length of the conducting channel 110; $v_l$ is defined by $(q*(V_{bi}+V)/kT)-2$ where $V_{bi}$ is the built-in potential and V is the applied voltage. For an n-concentration of 10**16/cc the maximum depletion width is on the order of 1 micron.

FIG. 2 is a schematic illustration of the multiplexing device of FIG. 1, showing the scannable conducting channel 110 with a relatively wider width, in a second position within the scanning region 106.

Figure 3:
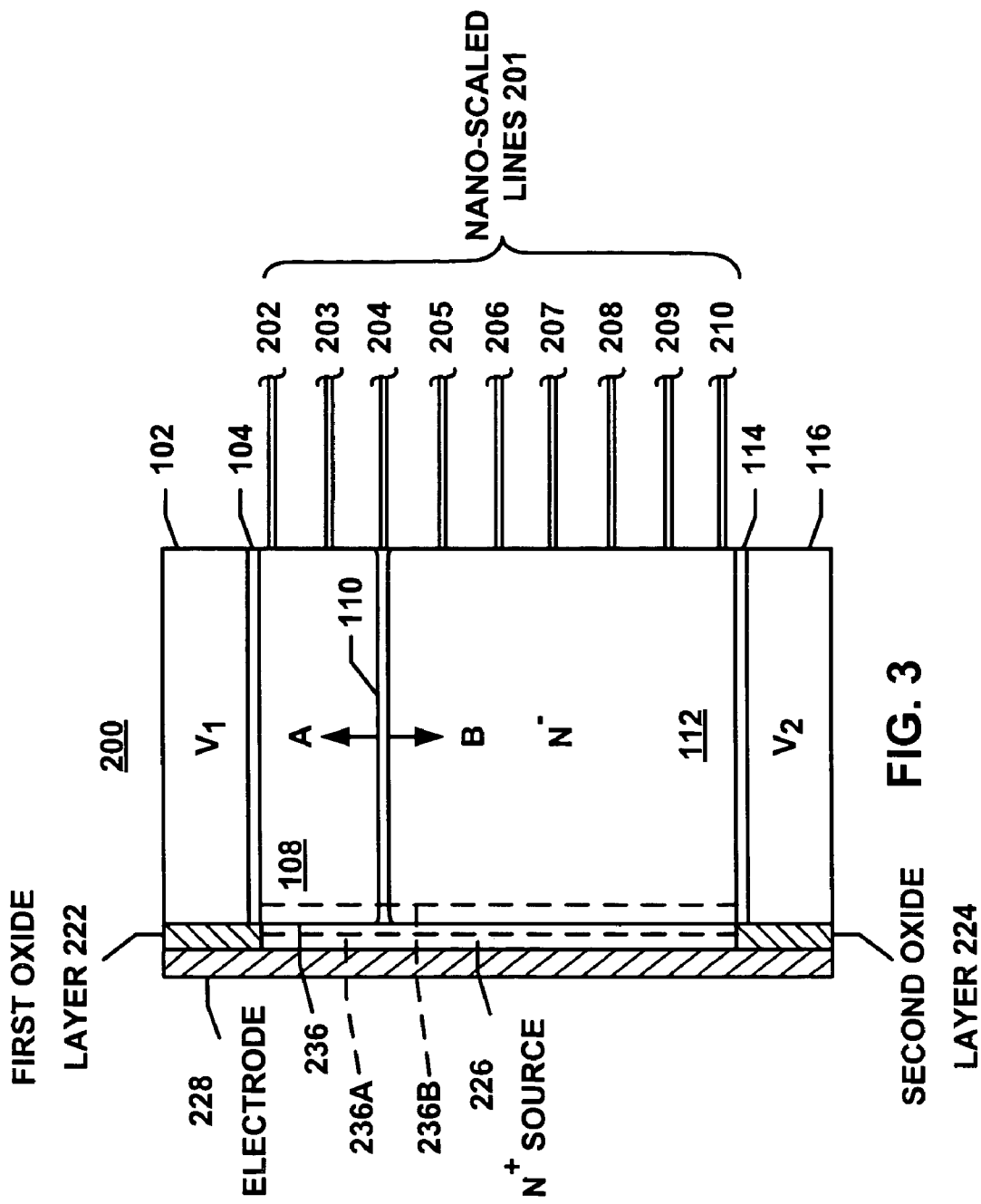
FIG. 3 is a schematic illustration of another embodiment of the multiplexing device of FIGS. 1 and 2, wherein the scannable conducting channel connects conducting lines, such as nano-scaled lines, on one side of the multiplexing device to electrodes on the opposite side of the multiplexing device.

FIG. 3 illustrates another multiplexing device 200 according to an alternative embodiment of the present invention, wherein the scannable conducting channel 110 connects conducting lines 201, such as nano-scaled lines 202 through 210 (e.g., having a width between approximately 5 angstroms and 1,000 angstroms), on one side of the multiplexing device 200, to one or more electrodes 228 on the opposite side of the multiplexing device 200. To this end, the multiplexing device 200 further includes a source 226, a first oxide layer 222, and a second oxide layer 224.

In this exemplary embodiment, the first oxide layer 222 is in contact with the first control gate 102 and the first gate oxide layer 104. Similarly, the second oxide layer 224 is in contact with the second control gate 116 and the second gate oxide layer 114. The source 226 is formed intermediate the first oxide layer 222 and the second oxide layer 224, in contact with the scanning region 106, and the electrode 228. Layers 222 and 224 serve to isolate the gate regions 102 and 116 from the electrode (228) and source (226).

The source 226 can be formed of a silicon or polysilicon layer that is doped with either an n-type dopant, or a p-type dopant. The source 226 could be formed of any conductive or semiconductive material that forms an electrical contact to the scanning region 106 and electrode 228. In this exemplary embodiment, the source 226 is doped with an n+-type dopant. In operation, the conducting channel 110 is generated as explained earlier in connection with FIGS. 1 and 2, and is scanned across the scanning region 106 to establish contact with the desired line, for example line 204, allowing the source 226 to inject electrons through the conducting channel 110, into the selected line 204.

In FIG. 3, the source 226 has an inner surface 236 that is illustrated as being generally flush with the oxide layers 222, 224. It should however be understood that the inner surface 236A of the source 226 could alternatively be recessed relative to the oxide layers 222, 224, as shown in a dashed line. Alternatively, the inner surface 236B of the source 226 could extend beyond the oxide layers 222, 224, as shown in a dashed line.

Figure 4:
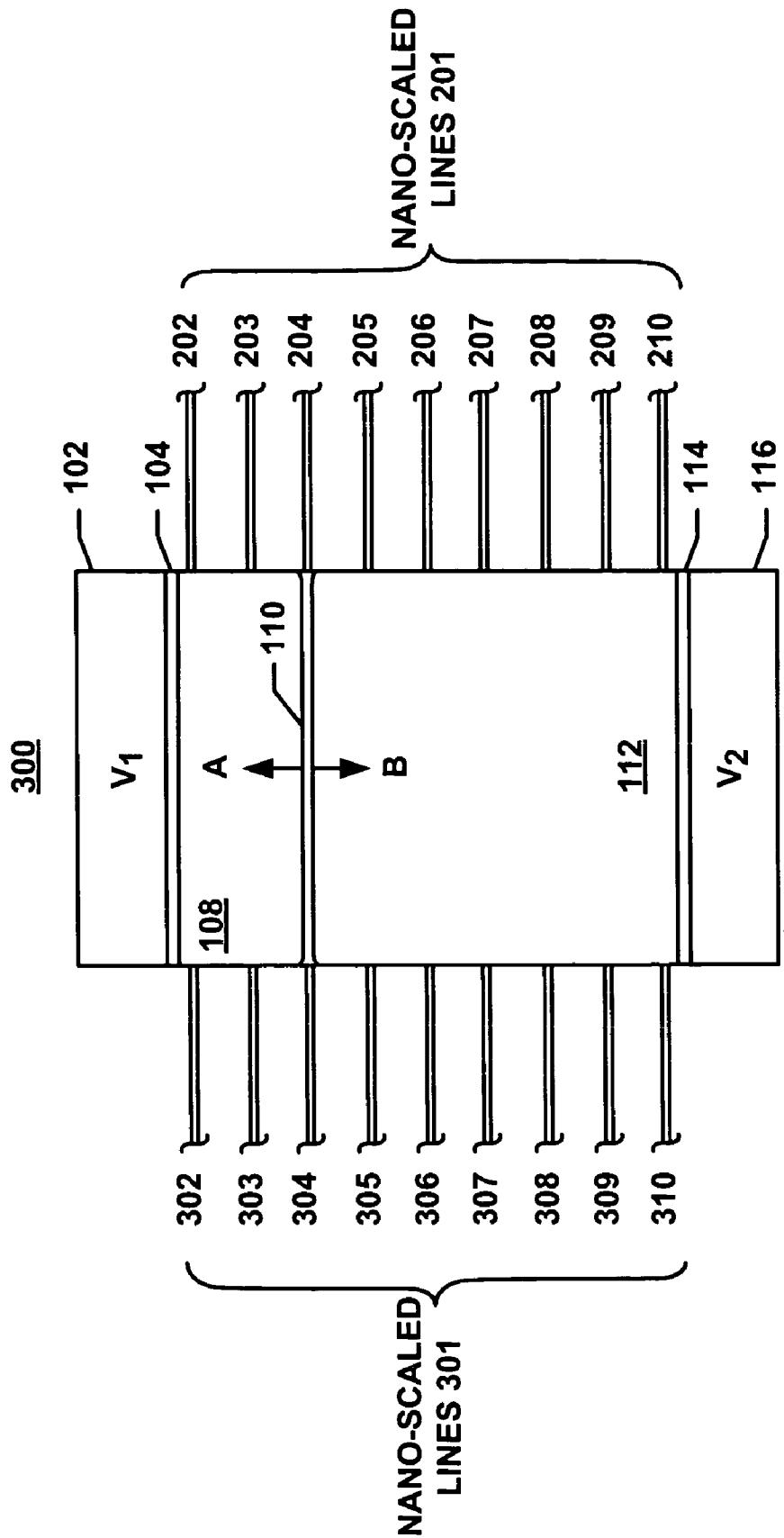
FIG. 4 is a schematic illustration of yet another embodiment of the multiplexing device of FIG. 3, wherein the scannable conducting channel connects conducting lines, such as nano-scaled lines, on one side of the multiplexing device to other conducting lines, such as nano-scaled lines, on the opposite side of the multiplexing device.

FIG. 4 illustrates another multiplexing device 300 according to the present invention. Multiplexing device 300 is generally similar in construction to the multiplexing device 200 of FIG. 3, but is designed for a different application. The scannable conducting channel 110 of the multiplexing device 300 connects conducting lines 201, such as nano-scaled lines 202-210, on one side of the multiplexing device 300, to other conducting lines 301, such as nano-scaled lines 302-310, on the opposite side of the multiplexing device 300.

In this exemplary embodiment, the lines 301 are coaxially aligned with the lines 201, so that the conducting channel 110 interconnects two aligned lines, such as lines 204 and 304.

Figure 5:
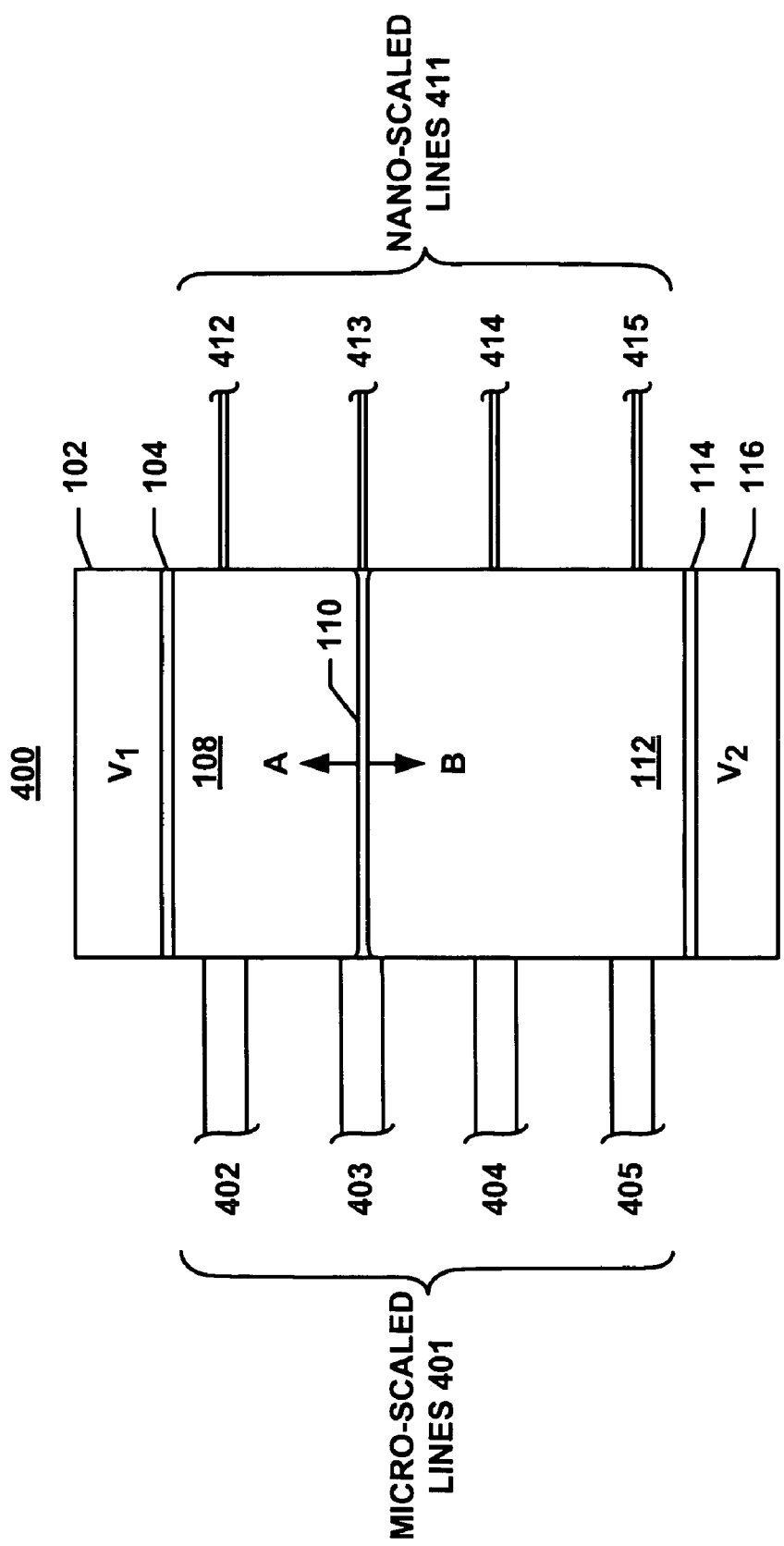
FIG. 5 is a schematic illustration of still another embodiment of the multiplexing device of FIG. 4, wherein the scannable conducting channel connects conducting lines, such as nano-scaled lines, on one side of the multiplexing device to other conducting lines, such as micro-scaled lines, on the opposite side of the multiplexing device.

FIG. 5 illustrates another multiplexing device 400 according to the present invention. Multiplexing device 400 is generally similar in construction to the multiplexing device 300 of FIG. 4, but is designed for a different application. The scannable conducting channel 110 connects conducting lines 401, such as nano-scaled lines 402-405, on one side of the multiplexing device 400 to other conducting lines 411, such as micro-scaled lines 412-415, on the opposite side of the device 400 (e.g., having a width that exceeds approximately 100 angstroms).

Figure 6:
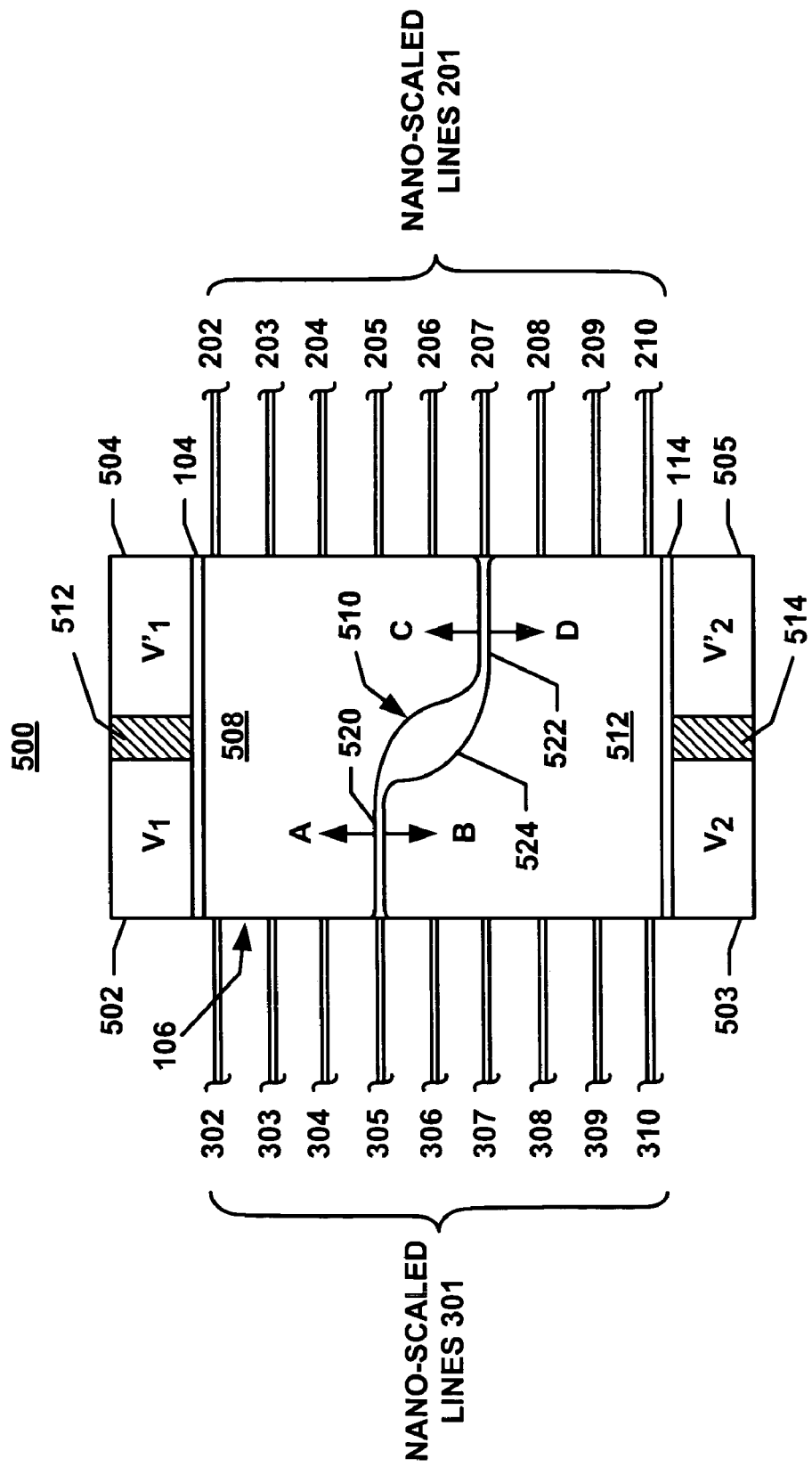
FIG. 6 is a schematic illustration of another embodiment of the multiplexing device of the previous figures, wherein the scannable conducting channel is curvilinearly (non-linearly) controlled, to connect non-coaxially (or coplanarly) disposed lines on both sides of the multiplexing device.

FIG. 6 illustrates another multiplexing device 500 according to the present invention. Multiplexing device 500 is generally similar in construction to the multiplexing devices 100, 200, and 300 of FIGS. 1-3, but will be described, for simplicity of illustration, in connection with the design of multiplexing device 300 of FIG. 4. The scannable conducting channel 510 is curvilinearly (non-linearly) controlled, to connect non-coaxially (or coplanarly) disposed lines 201, 301 on both sides of the multiplexing device 500.

In order to effect this curvilinear conducting channel 510, the multiplexing device 500 is provided with four control gates 502, 503, 504, 505 that are arranged in pairs, on opposite sides of the scanning region 106. In this specific example, the control gates 502, 504 are disposed, adjacent to each other, on one side of the scanning region 106, and are separated by an insulation layer 512. Similarly, the control gates 503, 505 are disposed, adjacent to each other, on the opposite side of the scanning region 106, and are separated by an insulation layer 514.

Potentials can be applied independently to the control gates 502-505, to generate a first depletion region 508 and a second depletion region 512, so that the conducting channel 510 is curvilinear. To this end, control gates 502 and 503 are paired, so that when a potential $V_1$ is applied to the control gate 502 and a potential $V_2$ is applied to the control gate 503, a first portion 520 of the conducting channel 510 is formed. Similarly, when a potential $V'_1$ is applied to the control gate 504 and a potential $V'_2$ is applied to the control gate 505, a second portion 522 of the conducting channel 510 is formed.

Portions 520 and 522 of the conducting channel 510 are not necessarily co-linear, and are interconnected by an intermediate curvilinear section 524. As a result, it is now possible to connect line 207 to line 305 even though these two lines are not co-linearly disposed. Other lines on opposite (or different) sides of the multiplexing device 500 could be interconnected by the conducting channel 510, by independently scanning the first and second portions 520, 522 of the conducting channel 510, along the arrows (A, B) and (C, D), respectively.

While FIG. 6 illustrates only four control gates 502-505, it should be clear that more than four gates can alternatively be used.

FIG. 6A illustrates another multiplexing device 550 according to the present invention. Multiplexing device 550 is generally similar in construction to the multiplexing device 500 of FIG. 6. Similarly to FIG. 6, the scannable conducting channel 510 is curvilinearly (non-linearly) controlled, to connect non-coaxially (or coplanarly) disposed lines 201, 301 on both sides of the multiplexing device 550. However, the switching device 550 comprises two discrete depletion regions 551, 552 that are separated by an intermediate, electrically conducting transition region 555.

In order to effect the curvilinear conducting channel 510, the multiplexing device 500 is provided with four control gates 562, 563, 564, 565 that are arranged in pairs, on opposite sides of the scanning regions 551, 552, wherein each pair of control gates is separated from the other pair by the intermediate transition region 555. In this specific example, the control gates 562, 564 are disposed, adjacent to each other, and are separated by the intermediate transition region 555, while the control gates 563, 565 are disposed, adjacent to each other, on the opposite side of switching device 550, and are separated by the intermediate transition region 555.

Potentials can be applied independently to the control gates 562-565, to generate the first depletion region 551 and the second depletion region 552, so that the conducting channel 510 is curvilinear. To this end, control gates 562 and 563 are paired, so that when a potential V1 is applied to the control gate 562 and a potential V2 is applied to the control gate 563, a first portion 520 of the conducting channel 510 is formed. Similarly, when a potential V'1 is applied to the control gate 564 and a potential V'2 is applied to the control gate 565, a second portion 522 of the conducting channel 510 is formed.

The switching device 550 further includes a plurality of gate oxide layers 572, 573, 574, and 575 that separate the control gates 562, 563, 564, and 565 from their respective depletion regions 551, 552.

While FIG. 6A illustrates four control gates 562-565 and one the intermediate transition region 555, it should be clear that more than four gates and one intermediate transition region 555 can be successively used to form the switching device 550.

Figure 7:
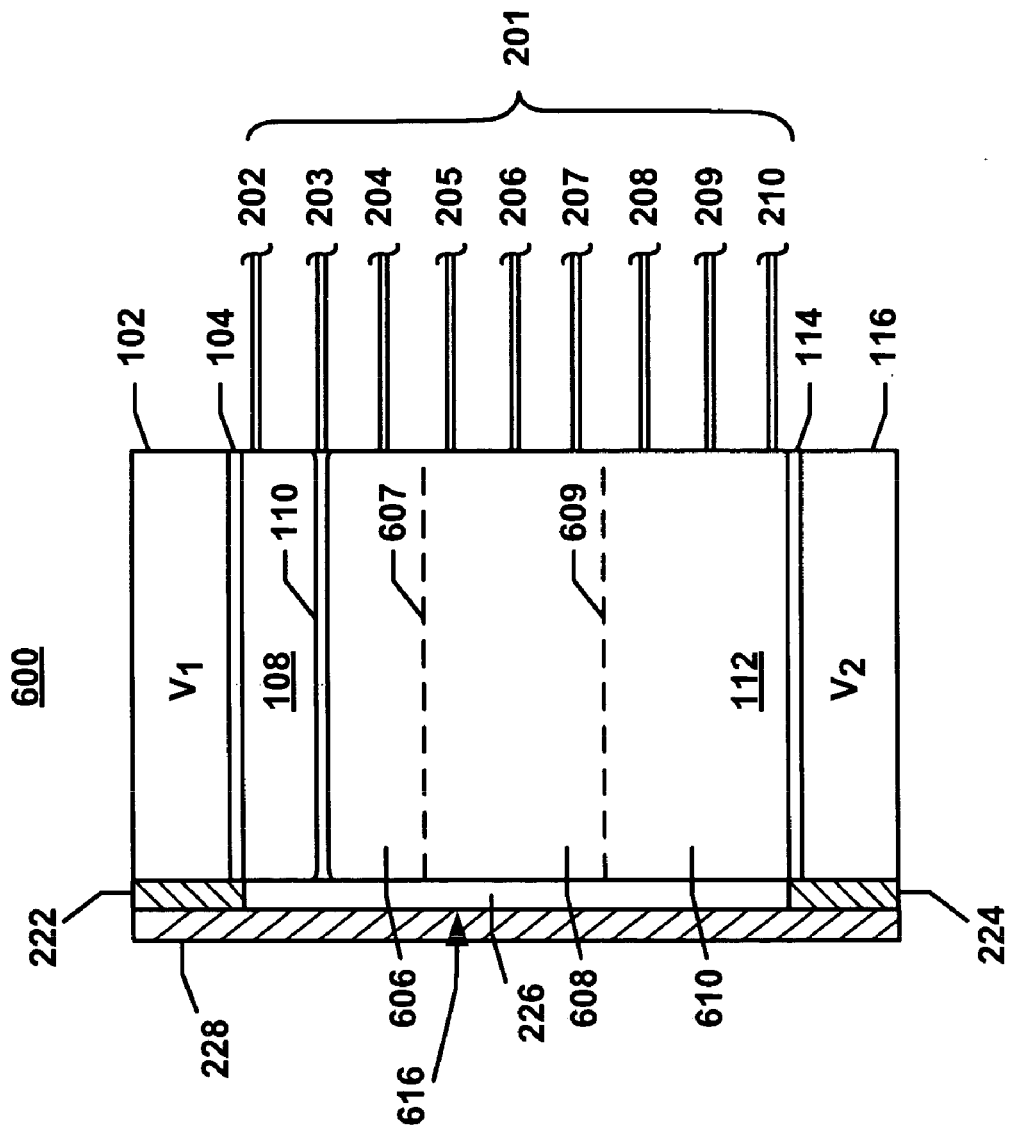
FIG. 7 is a schematic illustration of a further embodiment of the multiplexing device of the previous figures, wherein the scanning region is formed of a plurality of discrete regions.

FIG. 7 illustrates yet another multiplexing device 600 according to the present invention. Multiplexing device 600 is generally similar in construction to any of the previous multiplexing devices of FIGS. 1-6, but will be described, for simplicity of illustration, in connection with the design of multiplexing device 200 of FIG. 3. FIG. 7 illustrates the feature that the scanning region 616 could be continuous or formed of a plurality of discrete sub-regions, such as sub-regions 606, 608, 610 with boundaries 607, 609 therebetween.

Figure 7A:
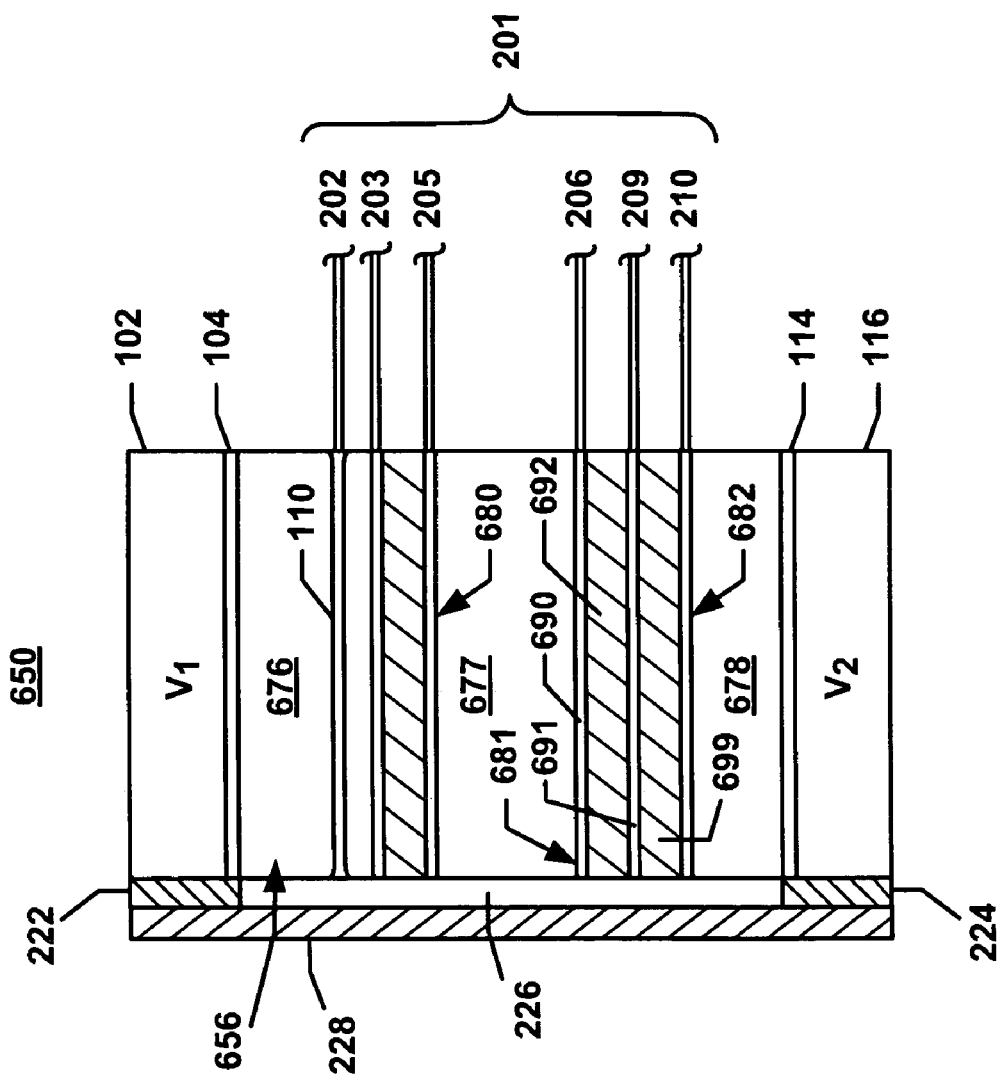
FIG. 7A is a schematic illustration of a further embodiment of the multiplexing device of FIG. 7, showing alternative embodiments of the discrete regions.

FIG. 7A illustrates a further multiplexing device 650 according to the present invention. Multiplexing device 650 is generally similar in construction to multiplexing device 600 of FIG. 7. The scanning region 656 of multiplexing device 600 is formed of a plurality of discrete sub-regions, such as sub-regions 676, 677, 678, with intermediate regions 680, 681, 682 therebetween. The intermediate regions 680, 681, 682 serve the function of extending the depletion regions 676, 677, 678 and further isolating the conducting channels from each other.

While only three intermediate regions 680, 681, 682 are illustrated, it should be clear that one or more intermediate regions may be formed. In this particular embodiment, the intermediate regions 680, 681, 682 are generally similar in design and construction, and are dispersed along the scanning region 656. In another embodiment, the intermediate regions 681, 682 are disposed contiguously to each other. The spacing between the intermediate regions 680, 681, 682 and the widths of all the regions in the embodiments described herein, could be changed to suit the particular applications for which the multiplexing devices are designed.

Considering now an exemplary intermediate region 681, it is formed of two semiconductor layers 690, 691 with an intermediate layer 692 having a high dielectric constant material that is sandwiched between the semiconductor layers 690, 691. According to another embodiment, the intermediate layer 692 is made of a semiconducting material that is different from that of layers 690 and 691 to form a quantum well structure.

Intermediate region 682 includes an intermediate region 699 that is generally similar to the intermediate region 692. Alternatively, the intermediate regions 692, 699 could have different work functions than the work function of semiconductor layer 691 so as to produce a quantum well function.

Figure 8:
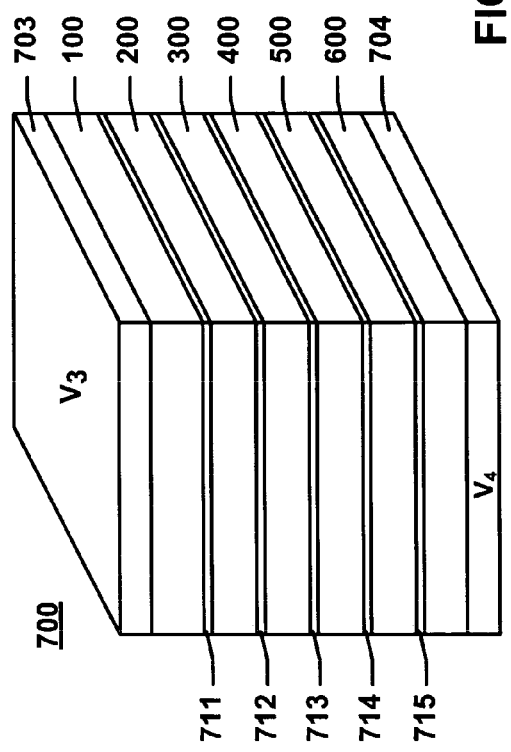
FIG. 8 is a schematic illustration of still another embodiment of the present invention, exemplifying a three-dimensional configuration comprised of a plurality of stackable multiplexing devices.

FIG. 8 illustrates another multiplexing device 700 of the present invention, exemplifying a three-dimensional configuration. Multiplexing device 700 is comprised of a plurality of stackable multiplexing devices, such as multiplexing devices 100, 200, 300, 400, 500, 600, that can be different or similar. Each of these stackable multiplexing devices can be independently controlled as described in connection with FIGS. 1-7.

According to this embodiment, one, or a group of multiplexing devices 100, 200, 300, 400, 500, 600 can be selected by applying suitable depletion potentials $V_3$, $V_4$, to two outer electrodes 703, 704, respectively. Once the multiplexing device or a group of multiplexing devices 100, 200, 300, 400, 500, 600 is selected, the selected multiplexing device or a group of multiplexing devices 100, 200, 300, 400, 500, 600 is operated individually, as described earlier.

Figure 9:
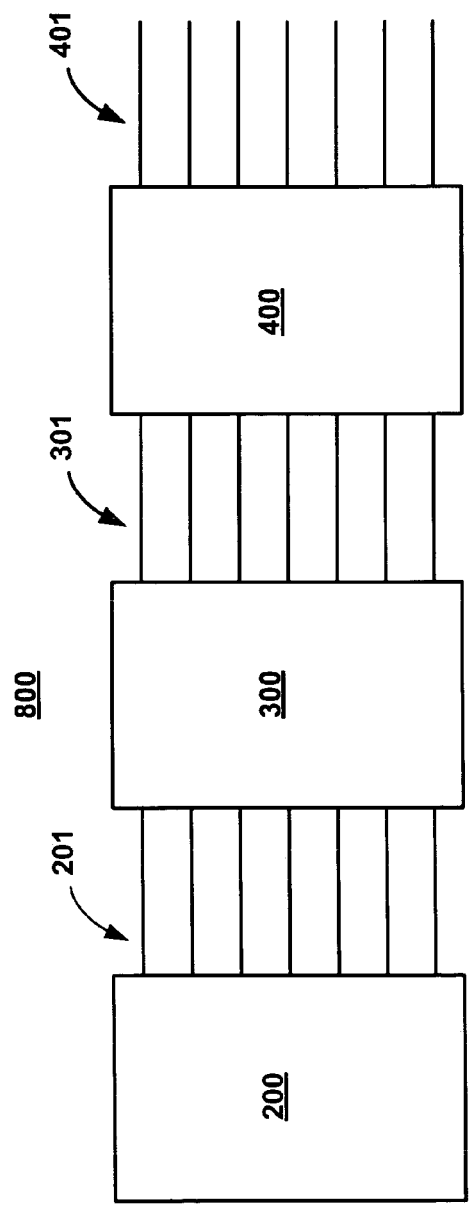
FIG. 9 is a block diagram illustrating a serial connectivity of a plurality of multiplexing devices of the previous figures.

FIG. 9 illustrates another multiplexing device 800 of the present invention, exemplifying the serial connectivity of a plurality of multiplexing devices, such as multiplexing devices 200, 300, 400. Each of these serially connected multiplexing devices 200, 300, 400 can be independently controlled, and the output of one multiplexing device used to control the accessibility of the subsequent multiplexing device.

Figure 10:
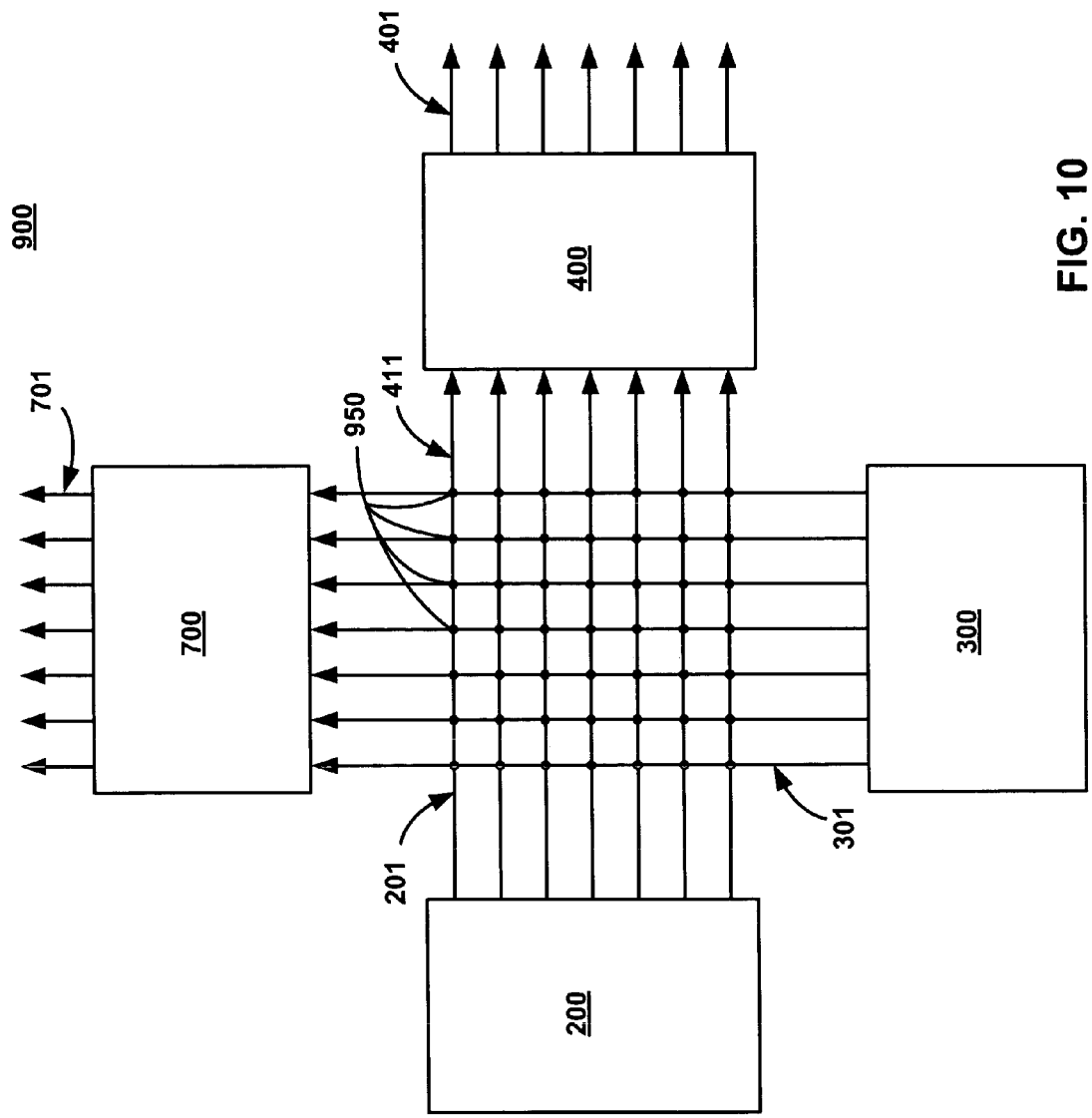
FIG. 10 is a perspective view of an exemplary multi-node cross-point array configuration using a plurality of multiplexing devices of the previous figures, illustrating a two-dimensional architecture.

FIG. 10 is a perspective view of an exemplary multi-node cross-point array 900 using at least two multiplexing device, e.g., 200, 300 whose respective outputs are selected as described above, onto output lines 201, 301, are selected as described above. The selected outputs are processed (collectively referred to as "processed outputs"), as desired, by for example, operational devices 950. The processed outputs can be used directly, or, as illustrated in FIG. 10, they can be further fed to one or more multiplexing devices, e.g., 400, 700, resulting in outputs that are fed to respective output lines 400, 700.

The operational devices 950 could be, for example, memory cells, logic devices, current-driven or voltage-driven elements, such as light emitters, heat emitters, acoustic emitters, or any other device that requires addressing or selective accessibility.

As an example, the operational device 950 can include a switchable element that is responsive to current change or voltage change, or phase change, resulting in change of resistance or magneto-resistance, thermal conductivity or change in electrical polarization. Alternatively, the operational devices can include a carbon nano tube, a cantilever, a resonance driven device, or a chemical or biological sensor.

Figure 11:
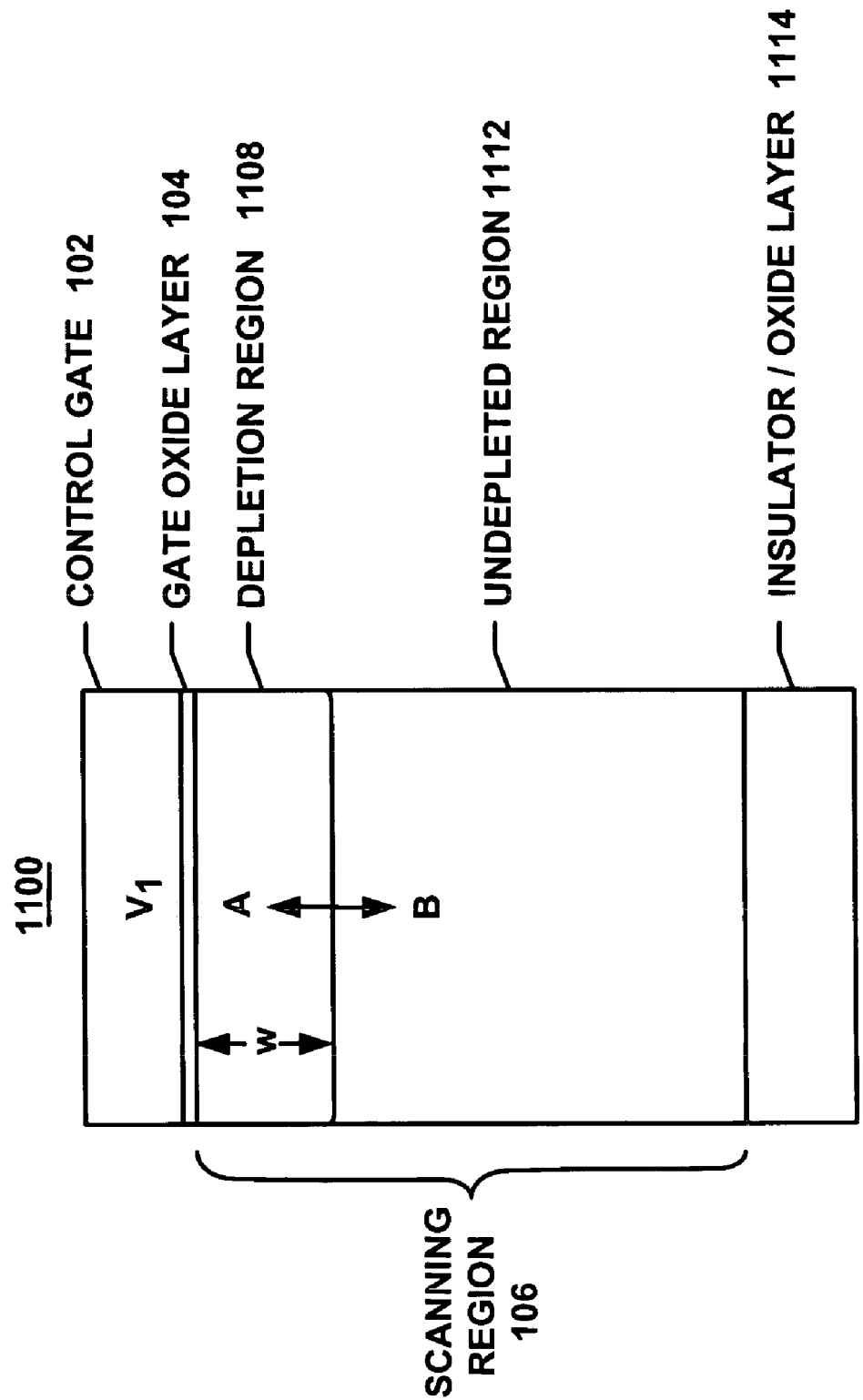
FIG. 11 is a schematic illustration of another exemplary multiplexing device of the present invention that is similar to the multiplexing device of FIG. 1, where the depletion region is controlled by a single electrode.

FIG. 11 is a schematic illustration of another exemplary multiplexing device 1100 according to the present invention. The multiplexing device 1100 is generally similar in design and operation to the multiplexing device 100 of FIG. 1, and comprises a conducting or undepleted region 1112 that is controllably scannable within a scanning region 106. The gate oxide layer 104 is disposed intermediate the scanning region 106 and the control gate 102, at one end of the multiplexing device 1100. At the opposite end of the multiplexing device 1100, an insulator layer, such as an oxide layer 1114, is disposed contiguously to the scanning region 106. It should be clear that the insulator layer 1114 is optional.

The depletion region 1108 is controlled by applying a potential V1 to the control gate 102, in order to generate the conducting region 1112. An important feature of the multiplexing device 1100 is to control the width w of the depletion region 1108 using a single control gate 102. Unlike the multiplexing device 100, the undepleted region 1112 of the multiplexing device 1100 is not necessarily a small region. It could, in some cases, encompass the entire scanning region 106 under the control gate 102 and the gate oxide 104. As further illustrated in FIG. 12, the multiplexing device 1100 enables concurrent multibit sequential programming.

Figure 12:
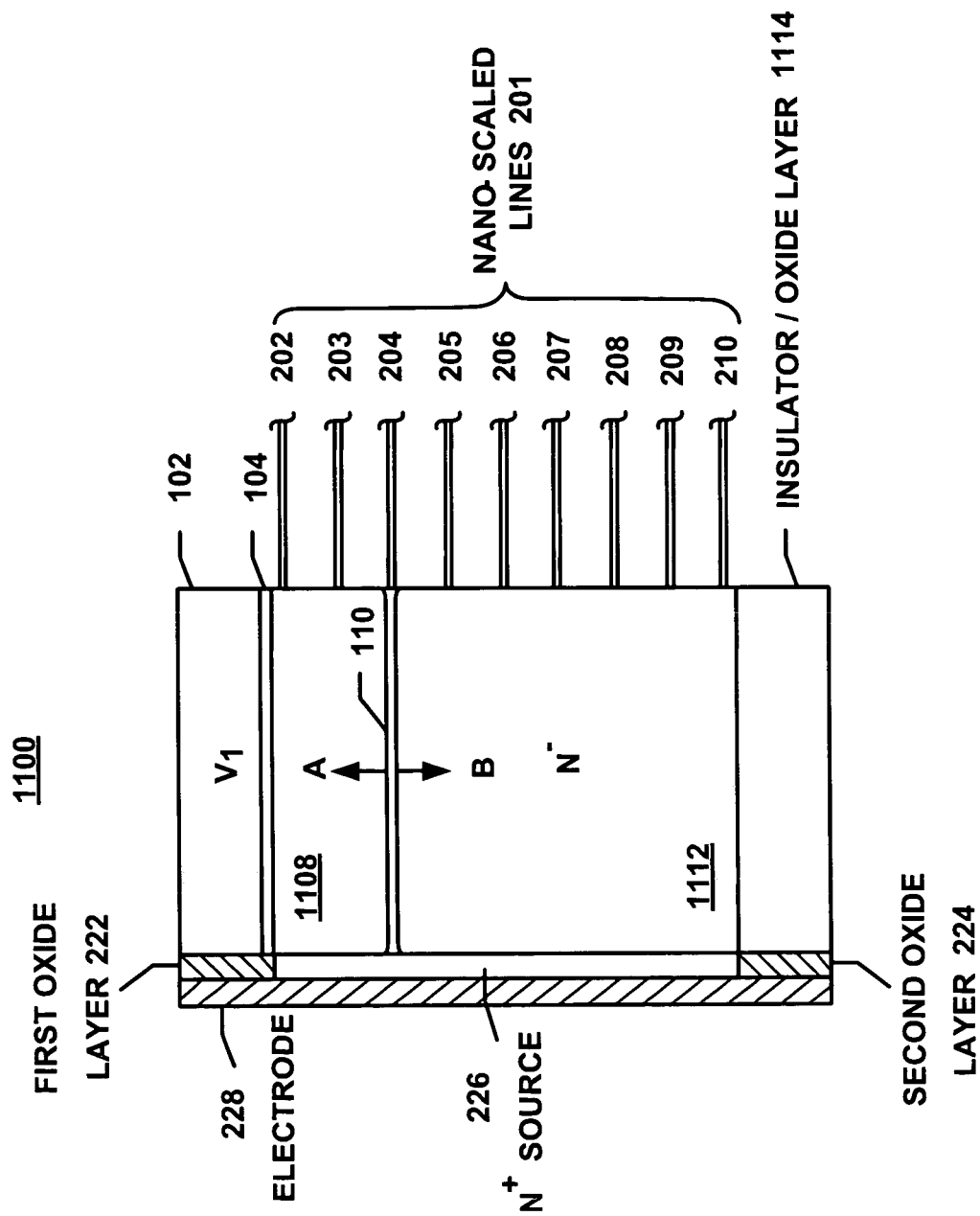
FIG. 12 is a schematic illustration of the multiplexing device of FIG. 11, wherein the scannable conducting channel connects conducting lines, such as nano-scaled lines, on one side of the multiplexing device to electrodes on the opposite side of the multiplexing device.

FIG. 12 is a schematic illustration of the multiplexing device 1100 of FIG. 11, wherein the scannable conducting channel 110 connects conducting lines, such as nano-scaled lines 201, on one side of the multiplexing device 1100 to electrodes (or to a micro line) on the opposite side of the multiplexing device 1100. Since the multiplexing device 1100 comprises a single control gate (or electrode) 102, many nano-scaled lines 201 could be selected for any value of the control gate potential $V_1$. This requires a serial access scheme as compared to a random access scheme used by the embodiments of FIGS. 1-8.

Figure 13:
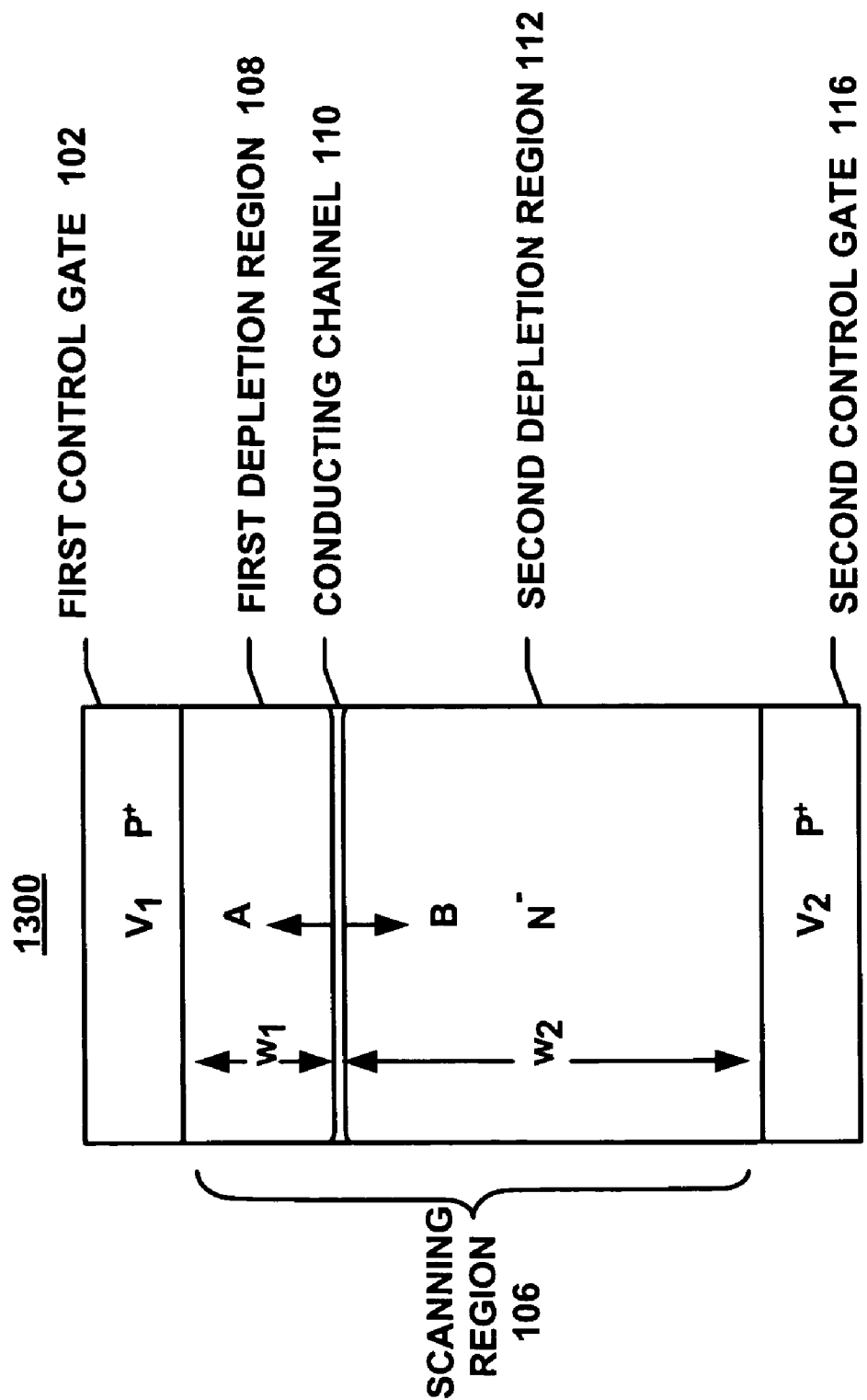
FIG. 13 is a schematic illustration of the multiplexing device of FIG. 1, where the depletion region is controlled by applying a reverse bias to a p-n (or p+-n or n+-p junction)

FIG. 13 is a schematic illustration of a multiplexing device 1300 that is similar to the multiplexing device 100 of FIG. 1, but without the two gate oxide layers 104, 114. In the previous embodiments, the depletion regions 108, 112 were comprised, for example of a depletion region of a Metal Oxide Semiconductor (MOS) system. However, the depletion regions 108, 112 of the multiplexing device 1300 of FIG. 13 form two p+-n junctions (or alternatively one p+-n junction) with the adjacent control gates 102, 116, respectively. In an alternative embodiment, the depletion regions 108, 112 form two n+-p junctions (or alternatively one n+-p junction) with the adjacent control gates 102, 116, respectively.

By applying potentials $V_1$ and $V_2$ to the p+ regions (control gates 102 and 116), a conduction channel 110 could be formed in around the middle of the scanning region 106. One of the advantages of this multiplexing device 1300 is that the breakdown voltages of p-n junctions can be higher than the gate oxide breakdown voltages. This means that higher voltages could be applied to the control gate 102, 116. This could also mean that the scanning region 106 could be bigger. In an alternative embodiment, the multiplexing device 1300 could be formed of a single control gate, such as control gate 102.

In yet another embodiment, the depletion regions 108,112 of the multiplexing device 1300 are formed by Schottky barriers (Metal—semiconductor regions), wherein the first and second control gates 102 and 116 are formed of a metal material. The depletion width in the Schottky barrier is controlled much the same way as the depletion width in a p-n junction.

Similarly to the illustration of FIG. 3, it is possible to select nano-scaled lines 201 by applying appropriate potentials V1 and V2 to the first and second control gates 102,116, respectively, and connect it to the micro-scaled line or source 226. Alternatively Schottky barriers (metal-n or metal-p) regions may be used to do the connection as well.

Figure 14:
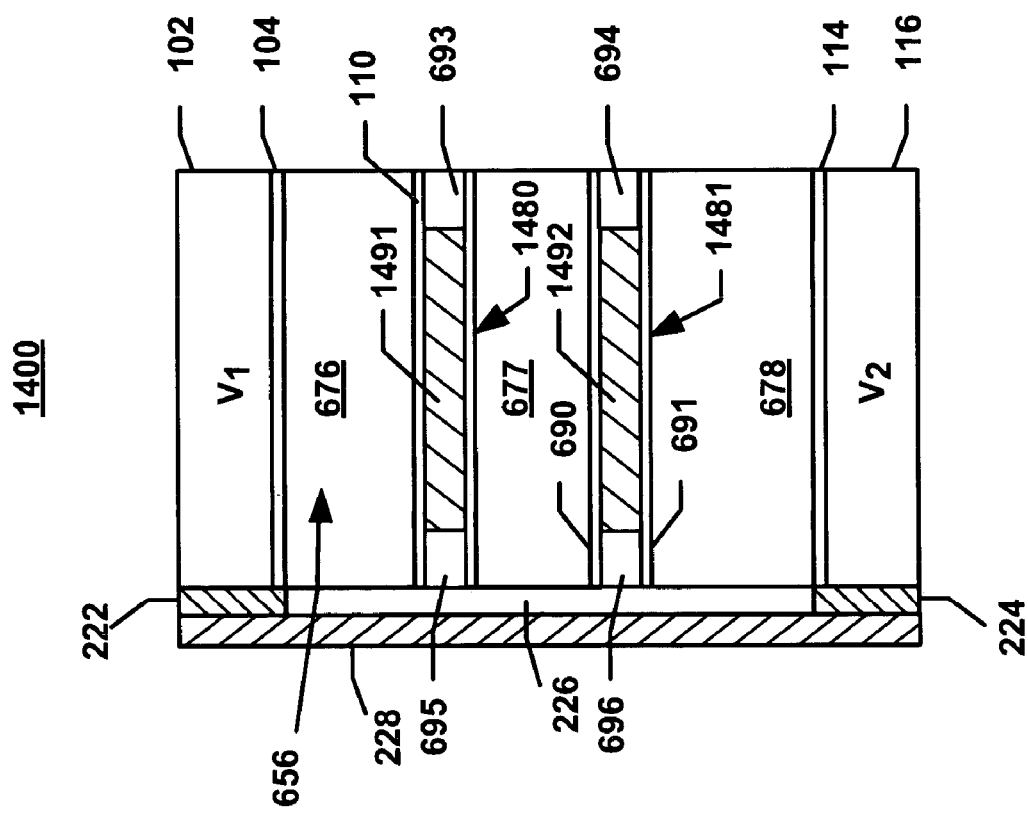
FIG. 14 is a schematic illustration of another embodiment of the multiplexing device of FIG. 7A, showing alternative embodiments of the intermediate regions.

FIG. 14 is a schematic illustration of another multiplexing device 1400 according to the present invention. The multiplexing device 1400 is generally similar in function and operation to the multiplexing device 650 of FIG. 7A, and shows an alternative embodiment of the intermediate regions 1480, 1481, in order to illustrate an exemplary instance of nano-pillar addressing.

In this embodiment, the semiconducting depletion regions 676, 677, 678 are physically separated through a combination of dielectrics (e.g., oxide/nitride/high-K) and electrode/semiconducting regions that are referred to as intermediate regions 1480, 1481. This allows a reduction in the leakage between the bits and extends the range of the maximum depletion region possible. This may also allow low voltage operation. Though only three semiconducting depletion regions 676, 677, 678 and two intermediate regions 1480, 1481 are shown for illustration purpose only, it should be clear that a different number of regions could alternatively be used.

Each semiconductor depletion region 676, 677, 678 is bounded by at least one thin dielectric layer, e.g., 690, 691, which is preferably but not necessarily composed of an oxide in order to passivate the sidewalls and to guarantee good electrical properties. Sandwiched between layers 690 and 691 in each intermediate region 1480, 1481 is a high-K dielectric material 1491, 1492, respectively. This minimizes the voltage drop between the intermediate regions 1480, 1481 while maintaining isolation. The high-K dielectric material 1492 could be any dielectric with a reasonable dielectric constant, wherein a higher dielectric constant provides better electrical properties.

Each of the intermediate regions 1480, 1481 further comprises two side insulation regions on opposite ends of the high-K dielectric material 1491, 1492. More specifically, intermediate region 1480 further comprises two side insulation regions 693, 695, and intermediate region 1481 further comprises two side insulation regions 694, 696. Side insulation regions 693-696 isolate the high-K dielectric material 1491, 1492 from the semiconducting depletion regions 676, 677, 678.

Alternatively, each of the dielectric layers 690, 691 comprises a thin dielectric material, typically oxide, that bounds the semiconducting depletion regions 676, 677, 678. However, the intermediate regions 1480, 1481 between the dielectric layers 690, 691 are filled with a semiconducting material or a metal material to form regions 1491, 1492. Each of the regions 1491, 1492 is preferably floating and its potential depends on the capacitive coupling of the different control electrodes 102,114 to these regions 1491, 1492.

This design is desirable for the following reasons. A heavily doped semiconductor or metallic region further minimizes the applied voltage requirements. In addition, the work function difference between the electrode/semiconductor region 1492 and the semiconductor region results in an inversion layer (thin layer of electrons) at the interface of the semiconducting depletion regions 676, 677, 678. This allows the multiplexing device 1400 to work via the depletion of the inversion layer charge as opposed to a charge resulting from ionized dopant atoms, and therefore minimizes dopant fluctuation effects. In this case, insulation regions 693-696 are required to prevent shorting of the electrodes (i.e., 1491, 1492) to the various semiconducting depletion regions 676, 677, 678 and to keep it electrically isolated. This effect is further illustrated in FIG. 15 using the example of a simple MOS device 1500.

As further illustrated in FIG. 7A, the multiplexing device 1400 of FIG. 14, wherein the scannable conducting channel 110 could be connected to conducting lines, such as nano-scaled lines 201, on one side of the multiplexing device 1400 to electrodes (or micro lines) on the opposite side of the multiplexing device 1400.

Figure 15:
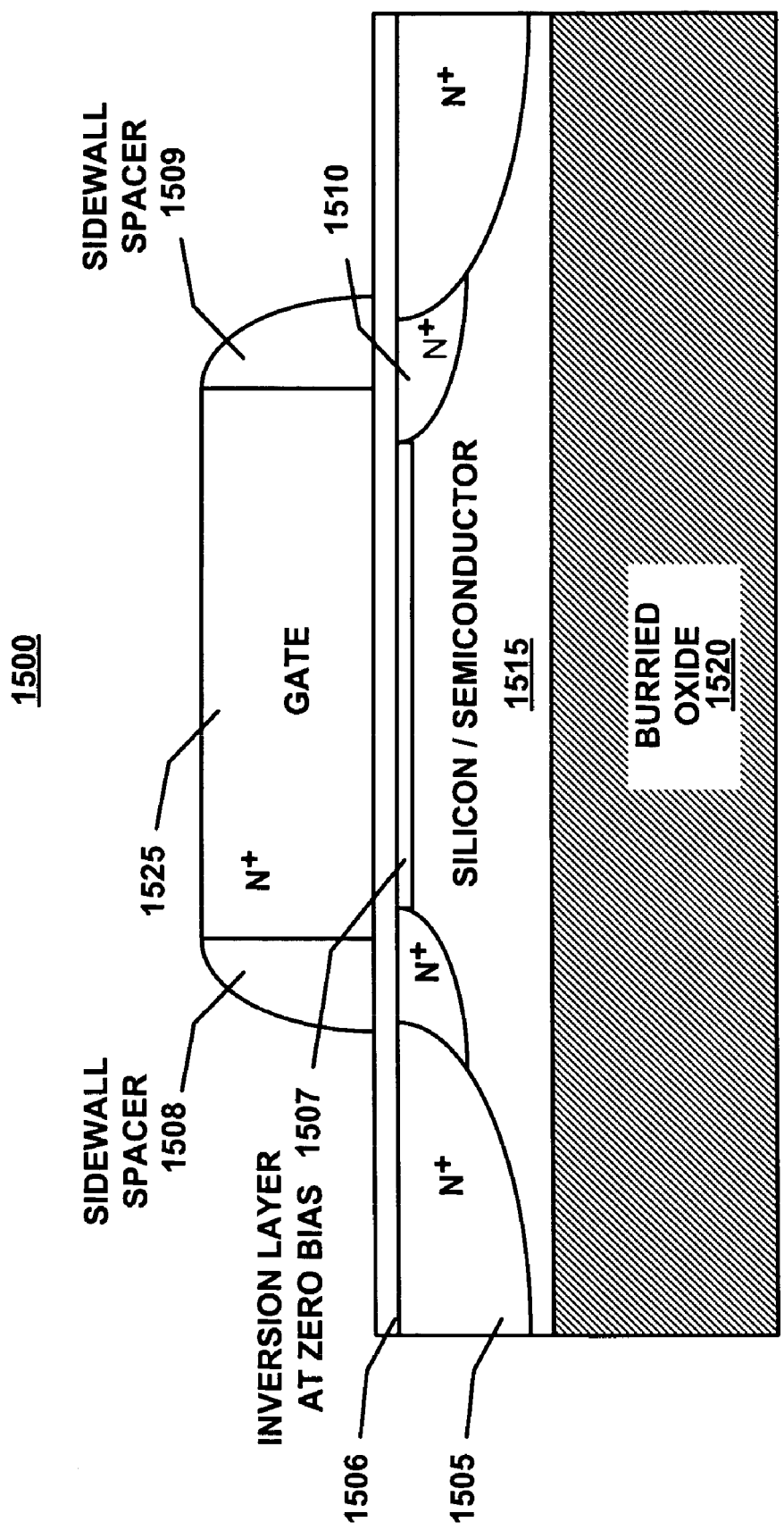
FIG. 15 is a schematic illustration of a semiconductor-on-insulator (e.g., SOI) MOSFET that shows the effects of a floating polysilicon region in the multiplexing device of FIG. 14.

FIG. 15 illustrates the effect of including floating poly-silicon/electrode regions (1491 and 1492 in FIG. 14 or 1525 in FIG. 15) in semiconducting structure 1500. Structure 1500 is generally formed of a silicon on insulator (SOI) wafer with a thin (e.g., less than approximately 100 nm) silicon region on top of an insulator (oxide). The MOS device includes an n− channel device with n+ source regions 1505 and drain regions 1510. The gate 1525 is formed of n+ polysilicon material. At zero bias gate, the potentials of the source 1505 and drain 1510 develop an inversion layer 1507 in the channel of semiconductor region 1515. This inversion layer 1507 is generated because of the work function difference between the gate 1525 and the silicon/semiconductor 1515. This work function difference causes the bands in the silicon 1515 at zero gate voltage to bend in much the same way as a transistor with positive applied bias. This inversion charge in the addressing scheme may be depleted in much the same way as dopant charge. One way to think about the transistor in FIG. 15 is that it emulates a negative threshold voltage transistor.

Figure 16:
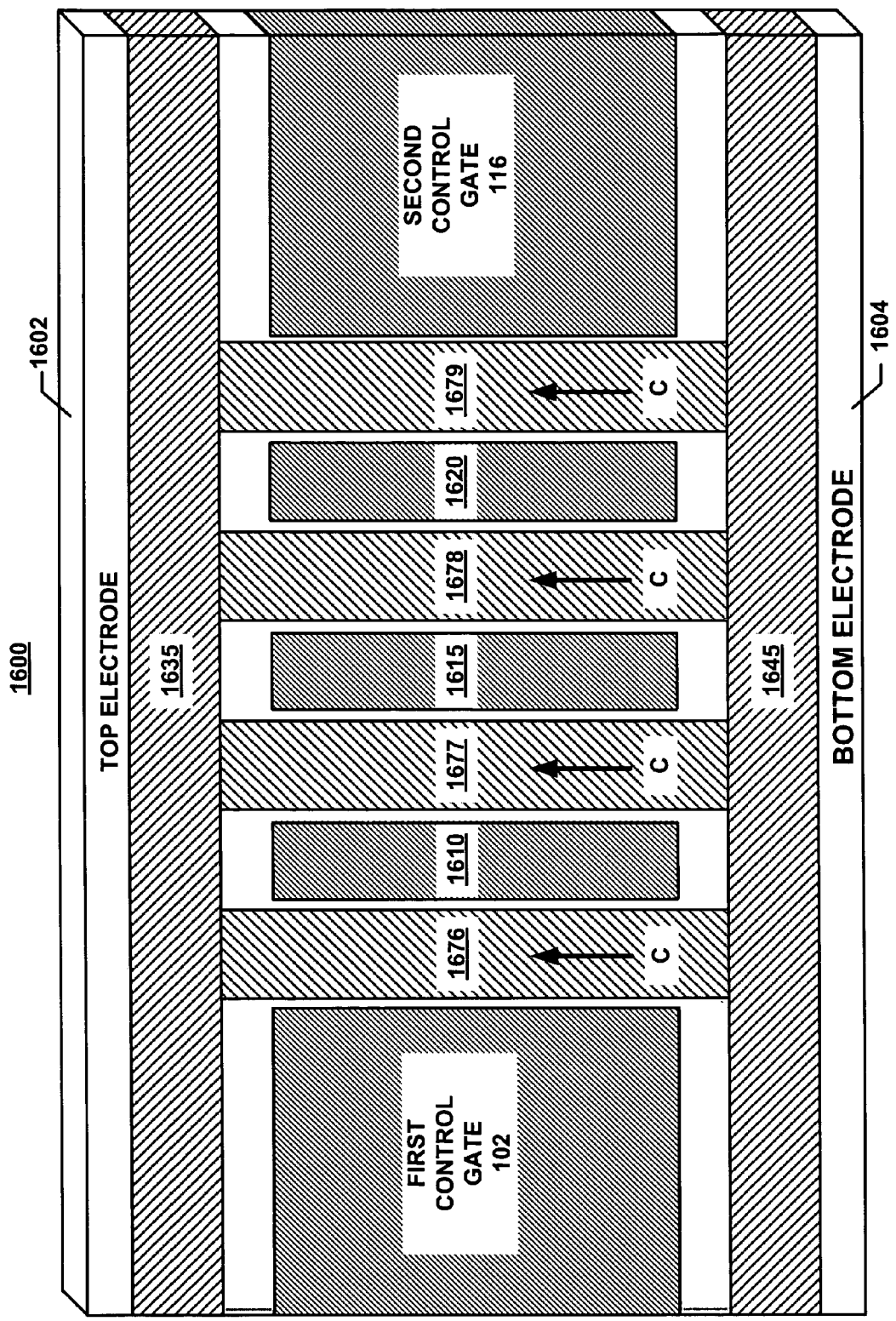
FIG. 16 is an isometric, schematic illustration of the multiplexing device of FIG. 14, rotated about its side.

Referring now to FIG. 16, it illustrates a multiplexing device 1600 according to the present invention. Multiplexing device 1600 is generally similar to multiplexing device 1400 of FIG. 14, but is rotated about its side. Multiplexing device 1600 comprises a plurality of nano-pillars 1676, 1677, 1678, 1679 that are interposed between the first control gate 102, the second control gate 116, and intermediate regions 1610, 1615, 1620. The intermediate regions 1610, 1615, 1620 are generally similar in construction and operation to the intermediate regions 1480, 1481 of FIG. 14. While four nano-pillars 1676, 1677, 1678, 1679 are illustrated, it should be clear that a different number of nano-pillars can be selected. A plurality of oxide/dielectric layers 1686, 1687, 1688 surround the intermediate regions 1610, 1615, 1620 to isolate them from the nano-pillars 1676, 1677, 1678, 1679, and the operational devices 1635, 1645.

Arrows C indicate the direction of the electrical currents flowing through one or more nano-pillars 1676, 1677, 1678, 1679 selected by depletion, as described earlier. While the direction of the current is shown in the current direction, it should be clear that the current could alternatively flow in the opposite direction. The current flows between the two electrodes 1602, 1604, through operational devices 1635, 1645 (denoted earlier as operational devices 950).

Figure 17:
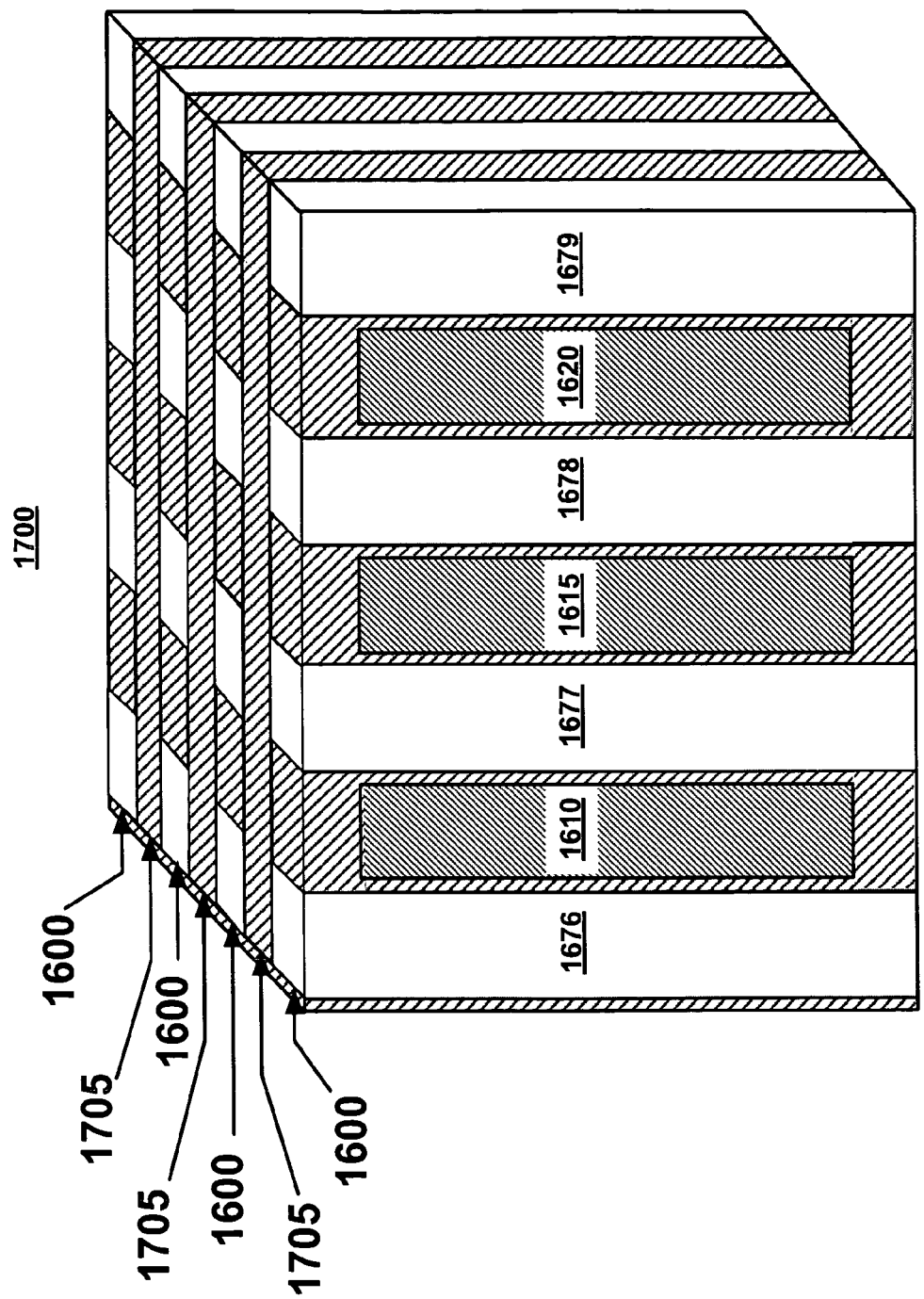
FIG. 17 is an isometric view of a multiplexing array formed of an array of multiplexing devices of FIG. 16.

FIG. 17 shows a multiplexing array 1700 that is formed of an array of multiplexing devices 1600 of FIG. 16, with the electrodes 1602, 1604, the operational devices 1635, 1645, and the control gates 102, 116 removed for clarity of illustration. The plurality of multiplexing devices 1600 are separated and insulated by a plurality of insulation layers 1705. The insulation layers 1705 are preferably, but not necessarily formed of oxide layers, and could alternatively be made of the same material as the intermediate region 1610. While only four multiplexing devices 1600 are illustrated, it should be clear that a different number of multiplexing devices 1600 can alternatively be used.

Figure 18:
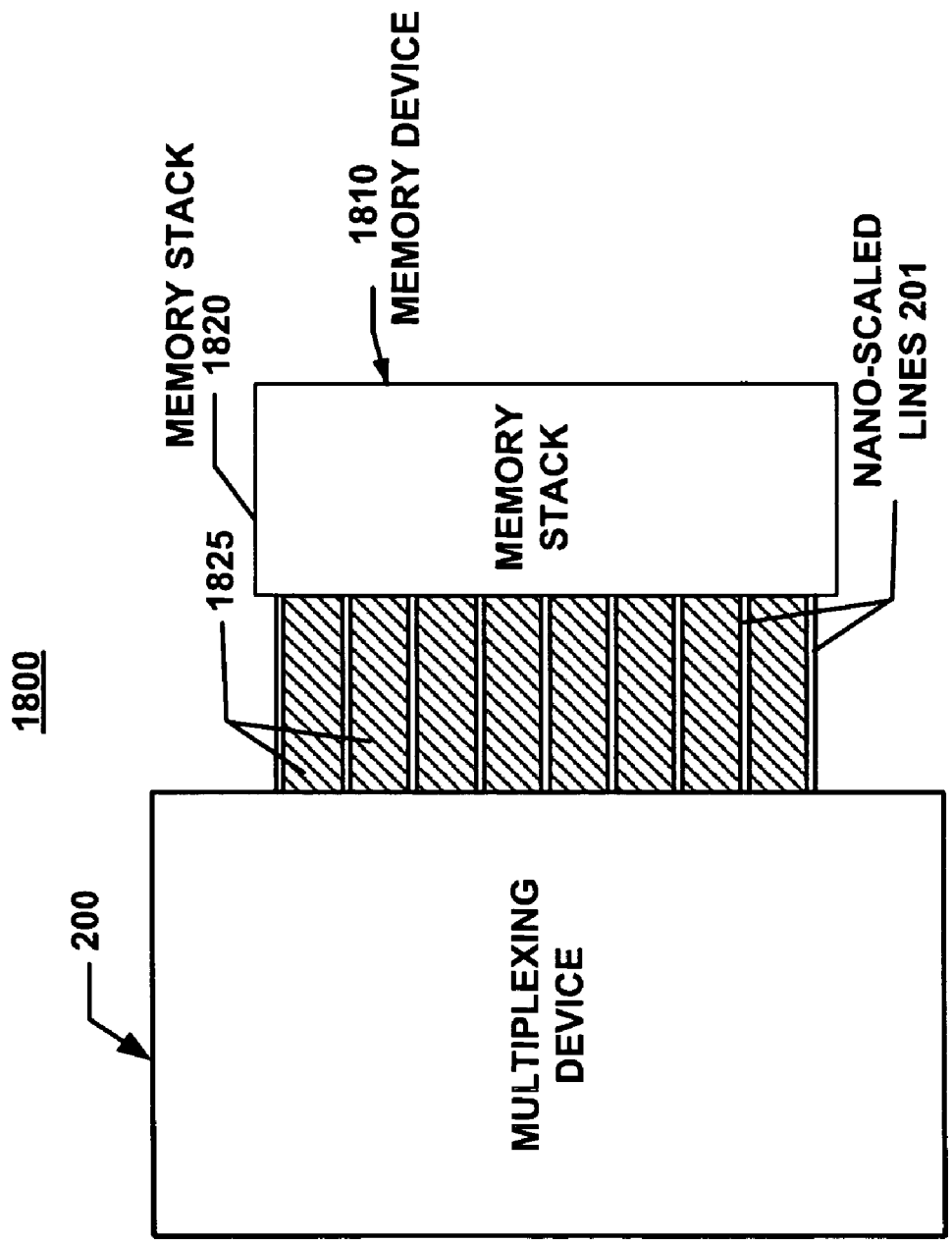
FIG. 18 illustrates a high-level architecture of a memory system according to the present invention.

FIG. 18 illustrates a high-level architecture of a memory system 1800 according to the present invention. The memory system 1800 generally includes a multiplexing device according to a desired embodiment selected from the various embodiments described earlier. For example purpose only, FIG. 18 shows the memory system 1800 as comprising multiplexing device 200.

The memory system 1800 further includes a memory device 1810 that is selectively accessible by the multiplexing device 200. To this end, memory device 1810 includes a memory stack 1820 and interconnecting lines, such as nano-scaled lines 201. The nano-scaled lines 201 are separated by intermediate insulation layers 1825 to provide insulation therebetween. It should be understood that FIG. 18 and other figures herein illustrate the general concept of the present invention, which is applicable to any memory configuration. As an example, the memory could be any one of: phase-change memory, floating-gate FLASH (both NOR and NAND), perovskite-based memory, floating-gate dynamic random access memory (DRAM), floating-body DRAM, SRAM, conventional DRAM, floating-gate DRAM, MISS diode SRAM, thyristor based SRAM, any cross-point memory in general, and any other memory.

Figure 19A:
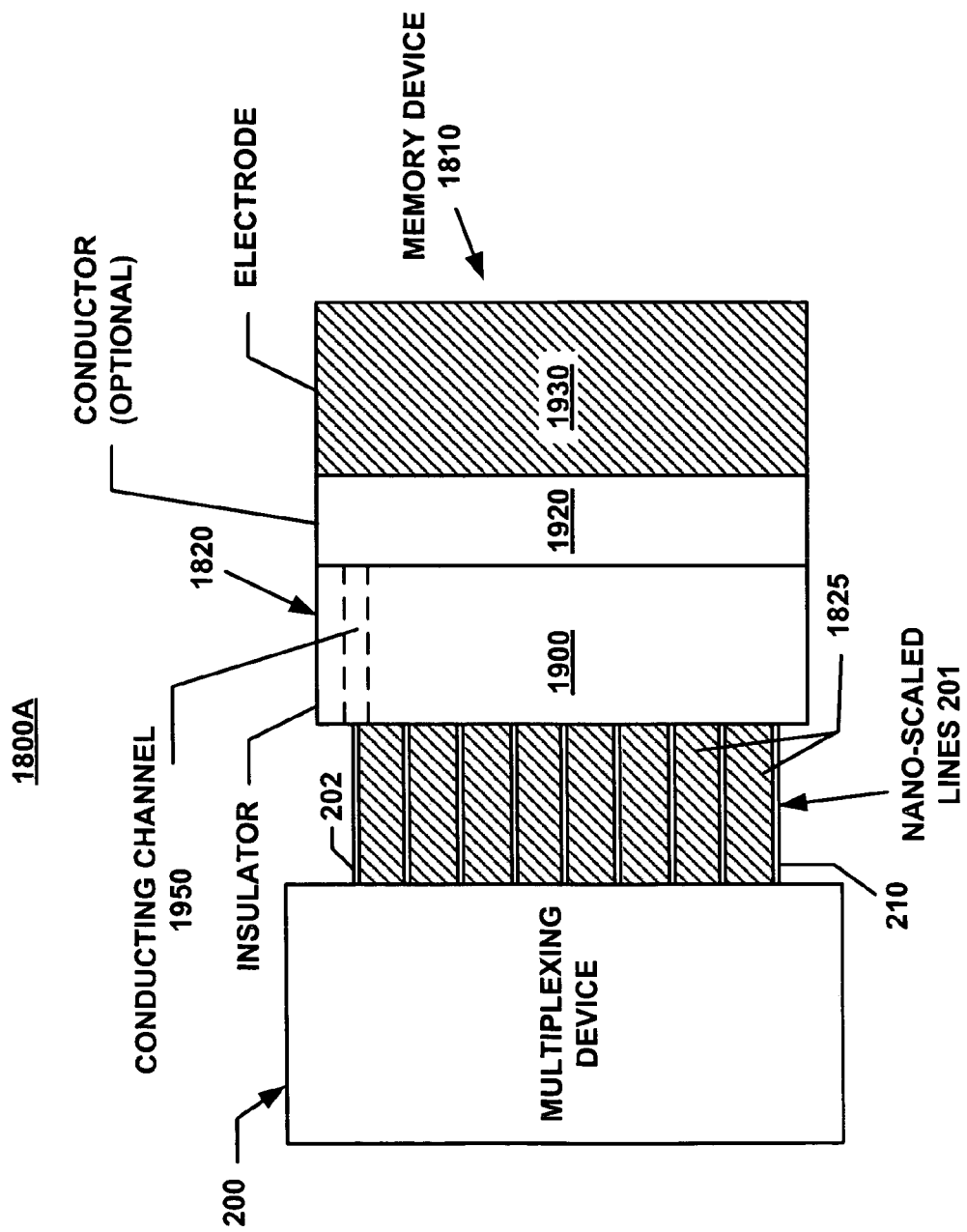
FIGS. 19A and 19B illustrate two exemplary embodiments of the memory system of FIG. 18.
Figure 19B:
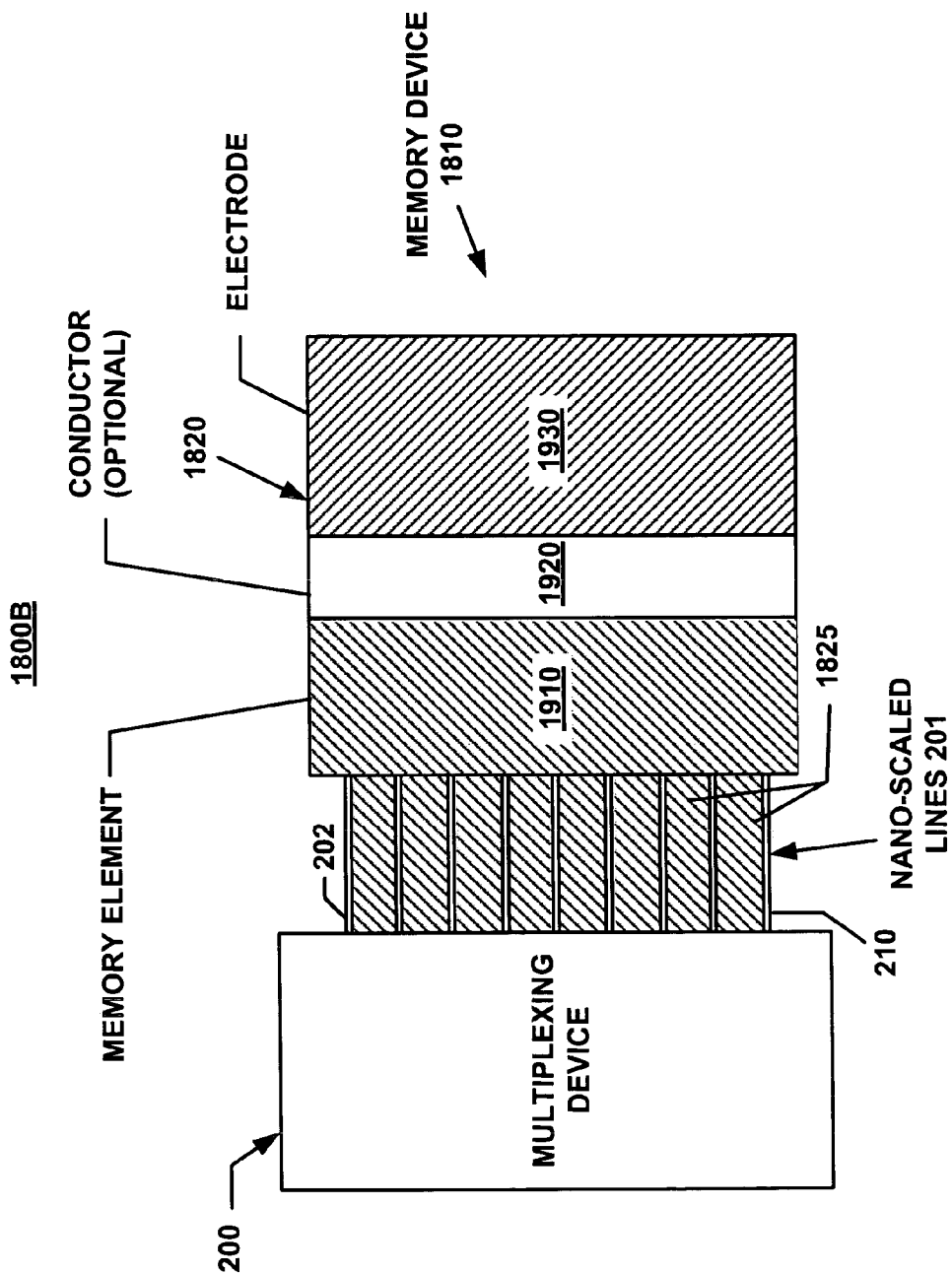

FIGS. 19A and 19B illustrate two exemplary embodiments of the memory system 1800 of FIG. 18, and provide more details about the structure and operation of the exemplary memory device 1810. According to the embodiment of FIG. 19A, the memory stack 1820 comprises a plurality of contiguously formed layers: an insulator layer 1900, an optional conducting layer 1920, and an electrode 1930.

The insulation layer 1900 is preferably formed of a high-resistance material. The conducting layer 1920 could be formed of any suitable electrically conductive material, such as metal, doped silicon, conductive GST, GeSb, TiN, etc. The electrode 1930 is formed of a electrically conductive material, such as metal, polysilicon, Ti, TiN, Al, W (Tungsten), or any other similar material.

In operation, the default initial state of the insulation layer 1900 is open or nonconducting. Upon selection of a nano-scaled line, e.g., 202, by the multiplexing device 200, as explained earlier, a high bias electric field (e.g., greater than approximately 15 MV/cm between the nano-scaled line 202 and electrode 1930) is applied to a corresponding data region of the insulation layer 1900, causing the insulation layer 1900 to break down in 1-10 us, to create a conducting channel 1950, in order the change the state of the data region of the insulation layer 1900, effectively writing data in the insulation layer 1900. The breakdown occurs due to degradation of the insulation layer 1900 by charge conduction and is irreversible (State 0). When the insulation layer 1900 breaks down, it acts like a short. If the applied electric field is less than 10 MV/cm, the insulation layer 1900 will not break down and remains in State 1. The voltages and fields described above are purely for illustration only and they depend on the material composing the insulation layer 1900.

If the insulation layer 1900 is in State 0, it conducts the electric current during a read condition, wherein a low bias electric current (e.g., less than 0.5V) is applied to the nano-scaled line 202. On the other hand, when the insulation layer 1900 is in State 1, it does not conduct the bias electric current in the read condition, since the insulation material blocks any flow of current at low applied bias.

In order to read the data stored in the insulation layer 1900, a low bias electric field (e.g., less than approximately 1-10 MV/cm between the nano-scaled line 202 and electrode 1930) is applied to a corresponding data region of the insulation layer 1900, permitting the reading of the stored data in the insulation layer 1900, by measuring the resistance of the region 1900.

According to the embodiment of FIG. 19B, the memory stack 1820 comprises a plurality of contiguously formed layers: a memory element 1910, an optional conducting layer 1920, and an electrode 1930.

The memory element 1910 is formed of any suitable memory material that selectively and controllably changes state or phase or resistance or spin or capacitance under specific, predetermined conditions. The memory element 1910 could be discrete or continuous. The memory material could be formed for example, of state change material such as: polysilicon, nitride, or any other similar material; or of phase change material, such as: GeSbTe, GeSbTeN, GeSb, GeSbN, or any other similar phase change material.

In operation, upon selection of a nano-scaled line, e.g., 202, by the multiplexing device 200, as explained earlier, a high bias (e.g., greater than 0.5V between the nano-scaled line 202 and electrode 1930), is applied to a corresponding data region of the memory element 1910, for a certain period of time (for example between 1 nanosecond and 1 microsecond) causing a change in the state or phase of the corresponding data region of the memory element 1910, effectively writing data in the memory element 1910 closest to the nanoscale line. On the other hand, the state or phase of the corresponding data region of the memory element 1910 remains unchanged when a low voltage is applied. Note that the voltages above depend on the material used for the memory.

In order to read the data stored in the memory element 1910, a low bias (e.g., less than approximately 0.5V) is applied between the nano-scaled line 202 and electrode 1930) is applied to a corresponding data region of memory element 1910, permitting the reading of the stored data, by measuring the resistance of the data region.

Figure 20:
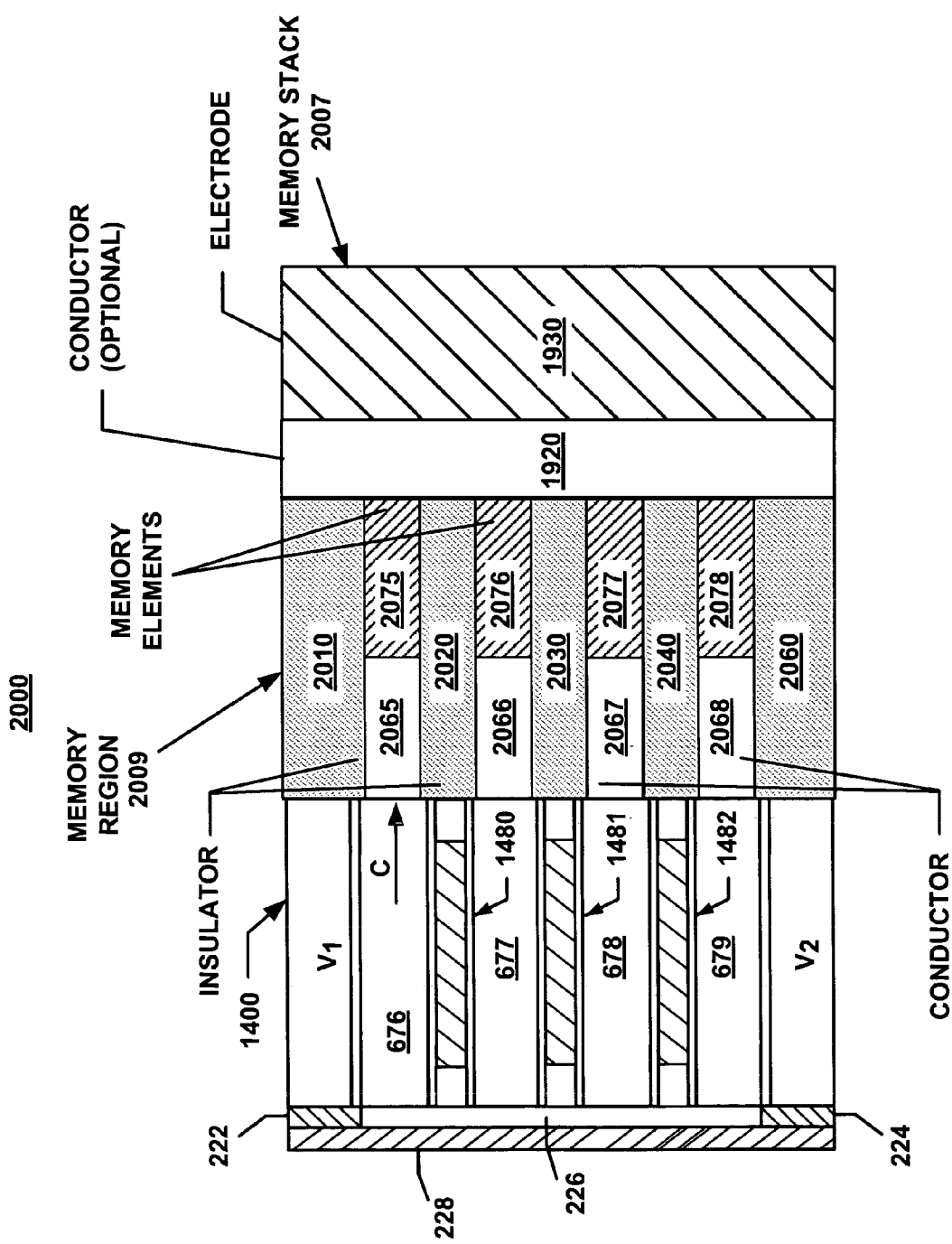
FIG. 20 illustrates another embodiment of a memory system according to the present invention.

FIG. 20 illustrates another embodiment of a memory system 2000, providing more details about the structure and operation of an exemplary memory stack 2007. According to this embodiment, the memory system 2000 includes a multiplexing device, such as multiplexing device 1400 (FIG. 14) and the memory stack 2007. The multiplexing device 1400 shows four exemplary sub-regions 676, 677, 678, 679, with four exemplary intermediate regions 1480, 1481, 1482, 1483.

The memory stack 2007 comprises a plurality of contiguously formed layers: a memory region 2009, an optional conducting layer 1920, and an electrode 1930. The memory region 2009 is formed of two end insulation layers 2010, 2060; a plurality of intermediate insulation layers 2020, 2030, 2040; and a plurality of memory channels (2065, 2075), (2066, 2076), (2067, 2077), and (2068, 2078).

The two end insulation layers 2010, 2060 are disposed at opposite ends of the memory region 2009 to insulate and protect the memory channels (2065, 2075) and (2068, 2078). The intermediate insulation layers 2020, 2030, 2040 are interposed between the memory channels (2065, 2075), (2066, 2076), (2067, 2077), and (2068, 2078) to insulate and protect these memory channels. The end insulation regions 2010, 2060 and the intermediate insulation layers 2020, 2030, 2040 are formed of an insulation material, such as, for example, oxide, nitride, low-K dielectric, high-K dielectric, or any other similar material.

The memory cells (2065, 2075), (2066, 2076), (2067, 2077), and (2068, 2078) will now be described in more detail in more detail in connection with the exemplary memory cell (2065, 2075). Memory cell (2065, 2075) is formed of two successive layers: an electrically conductive layer 2065 and a memory element 2075.

The conductive layer 2065 is formed of a high conductivity material, such as W (Tungsten), TaSiN, or any another suitable metal. The memory element 2075 is formed of any suitable memory material that selectively and controllably changes state or phase under specific, predetermined conditions. The memory material could be formed for example, of state change material such as: polysilicon, nitride, or any other similar material; or of phase change material, such as: GeSbTe, GeSbTeN, GeSb, GeSbN, or any other similar phase change material.

The conductive layer 2065 is disposed in contact with the sub-region 676 of multiplexing device 1400, so that bias electric current C passing through the selected sub-region 676 and the conductive layer 2065, to the memory element 2075, causes the desired state or phase change of the memory element 2075 to change, as described earlier in connection with FIG. 19. It should be clear that while in this embodiment the conductive layer 2065 is disposed in contact with the sub-region 676 of multiplexing device 1400, the conductive layer 2065 could be disposed in contact with, for example, nano-scaled lines 201 of other multiplexing devices described herein.

Figure 21:
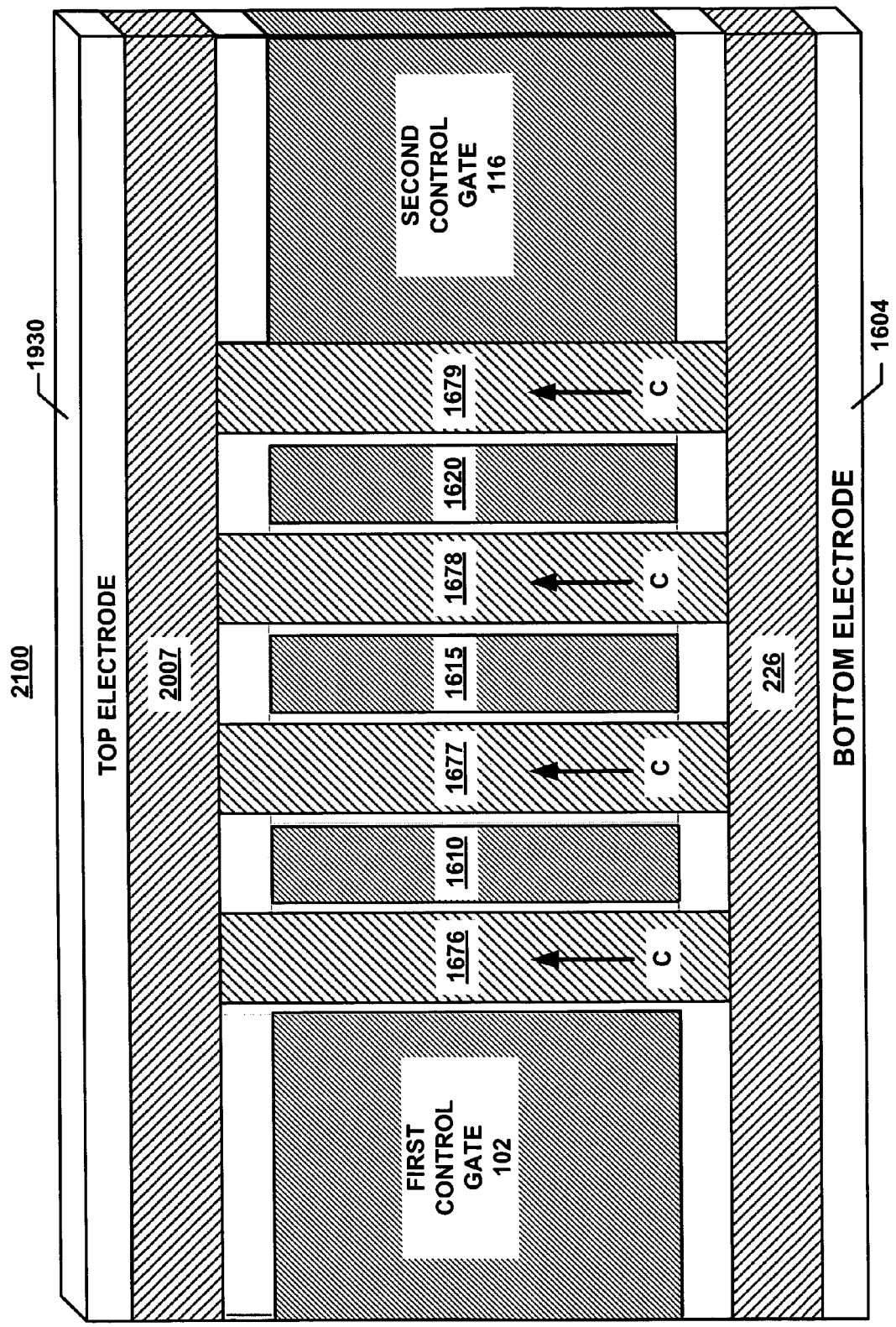
FIG. 21 illustrates yet another embodiment of a memory system according to the present invention.

FIG. 21 illustrates yet another embodiment of a memory system 2100 according to the present invention. Memory system 2100 is generally similar to the memory system 2000 of FIG. 20, but is rotated about its side. Memory system 2100 comprises the multiplexing device 14 of FIG. 14, or multiplexing device 1600 of FIG. 16 that includes a plurality of nano-pillars 1676, 1677, 1678, 1679 that are interposed between the first control gate 102, the second control gate 116, and intermediate regions 1610, 1615, 1620. The intermediate regions 1610, 1615, 1620 are generally similar in construction and operation to the intermediate regions 1480, 1481 of FIG. 14. While four nano-pillars 1676, 1677, 1678, 1679 are illustrated, it should be clear that a different number of nano-pillars can be selected. A plurality of oxide/dielectric layers 1686, 1687, 1688 surround the intermediate regions 1610, 1615, 1620 to isolate them from the nano-pillars 1676, 1677, 1678, 1679, and the operational devices 1635, 1645.

In this embodiment, the operational device (e.g., 1635) includes a memory cell of the present invention, such as memory cell 2007 of FIG. 20. The operation of memory system 2100 is similar to the operation of memory system 2000 described earlier in connection with FIG. 20.

Figure 22:
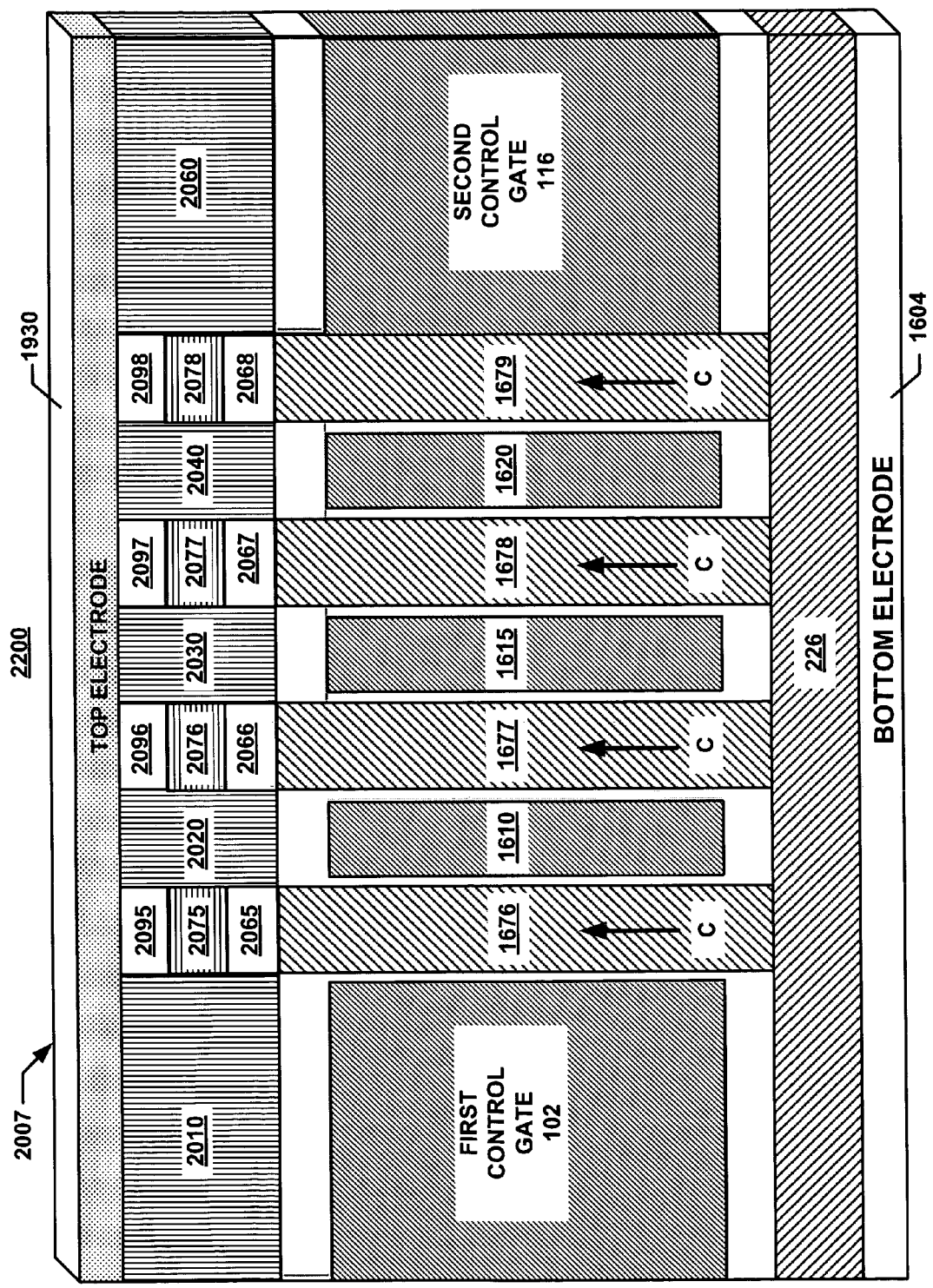
FIG. 22 further illustrates still another embodiment of a memory system according to the present invention.

FIG. 22 further illustrates yet another embodiment of a memory system 2200 according to the present invention. Memory system 2200 is generally similar to the memory system 2100 of FIG. 21, using the memory stack 2007 of FIG. 20.

The memory cells (2065, 2075, 2095), (2066, 2076, 2096), (2067, 2077, 2097), and (2068, 2078, 2098) form a phase change stack. As an example, memory cell (2065, 2075, 2095) is formed of three successive layers: a heater element 2065, a phase change element 2075, and another optional heater element 2095.

Figure 23:
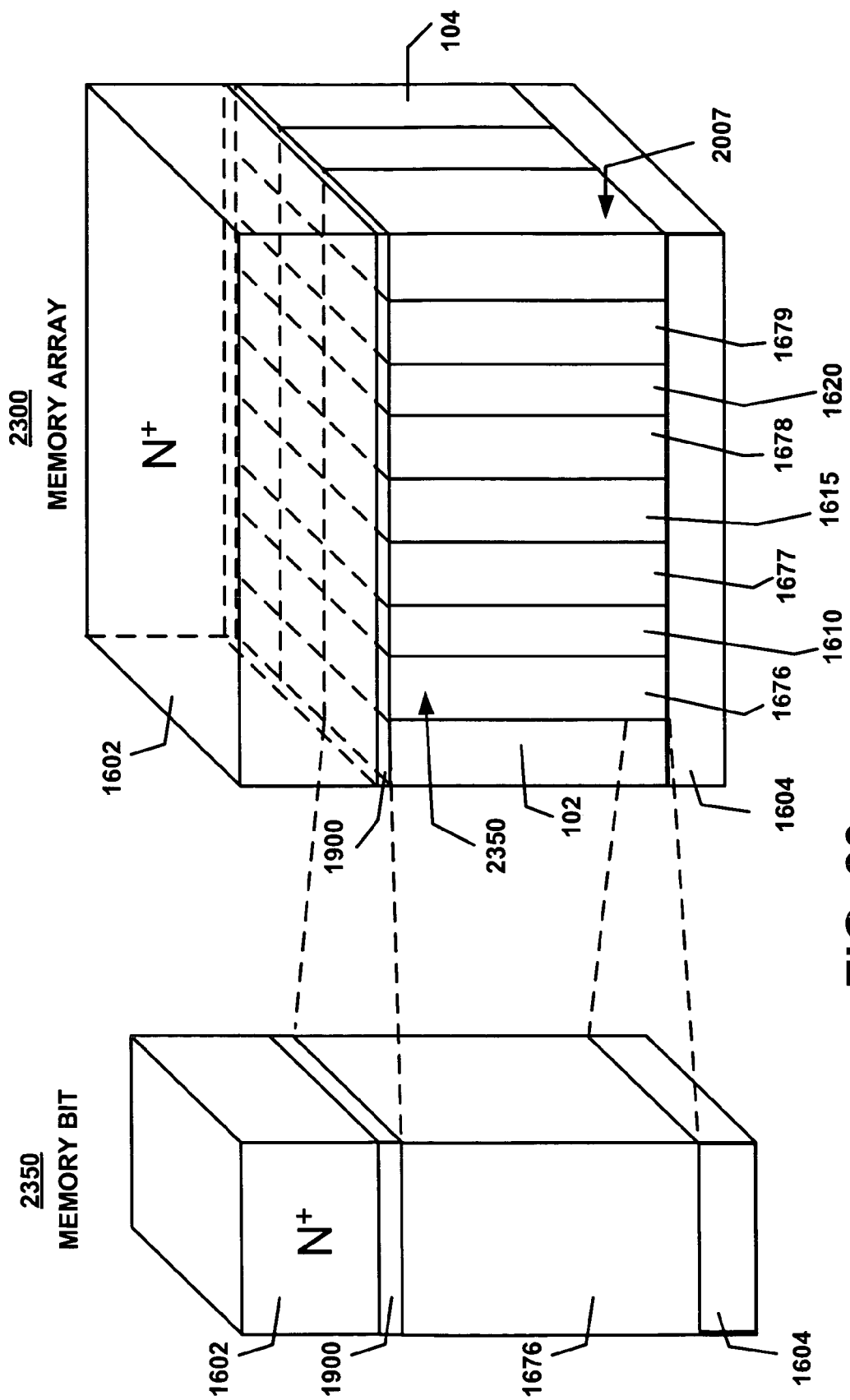
FIG. 23 illustrates a memory array that is formed of a plurality of memory systems that are juxtaposed to form a three-dimensional structure, and further illustrates an individual memory bit that forms part of the array.

FIG. 23 illustrates a memory array 2300 that is formed of a plurality of memory systems, such as memory system 2100 of FIG. 21, that are juxtaposed to form a three-dimensional structure. FIG. 23 also illustrates an individual memory bit 2350 (such as a PROM cell) of the array 2300.

The memory array 2300 represents a high-level embodiment of an antifuse structure with a thin 3 nm insulation layer 1900 formed between the top electrode (n+ polysilicon) 1602 and the bottom electrode (n− layer) 1604. As described earlier in connection with FIG. 19, the default state of the antifuse structure is open or nonconducting. The application of a high electric field (typically greater than 15 MV/cm) to the insulation layer 1900 causes the insulation layer 1900 to break down.

This breakdown occurs due to degradation of the dielectric by charge conduction and is irreversible (State 0). When the insulation layer 1900 breaks down, it acts like a short. If the applied electric field is less than 10 MV/cm, the insulation layer 1900 will not break down (State 1). If the insulation layer 1900 is in State 0, it conducts the electric current during the read condition. On the other hand, when the insulation layer 1900 is in State 1, it does not conduct the electric current in the read condition, since the insulation layer 1900 blocks the flow of the electric current at a low applied bias. The electric fields illustrated above are a function of the material in the antifuse layer. The bottom electrode 1604 of the antifuse structure is the nano-pillar of a multiplexing device 100, 200, etc.

The memory bit 2350 forms the building block for memory array 2300. Since the insulation layer 1900 is nonconducting, the insulation layer 1900 and the top electrode 1602 are common for the entire memory array 2300.

Figure 24:
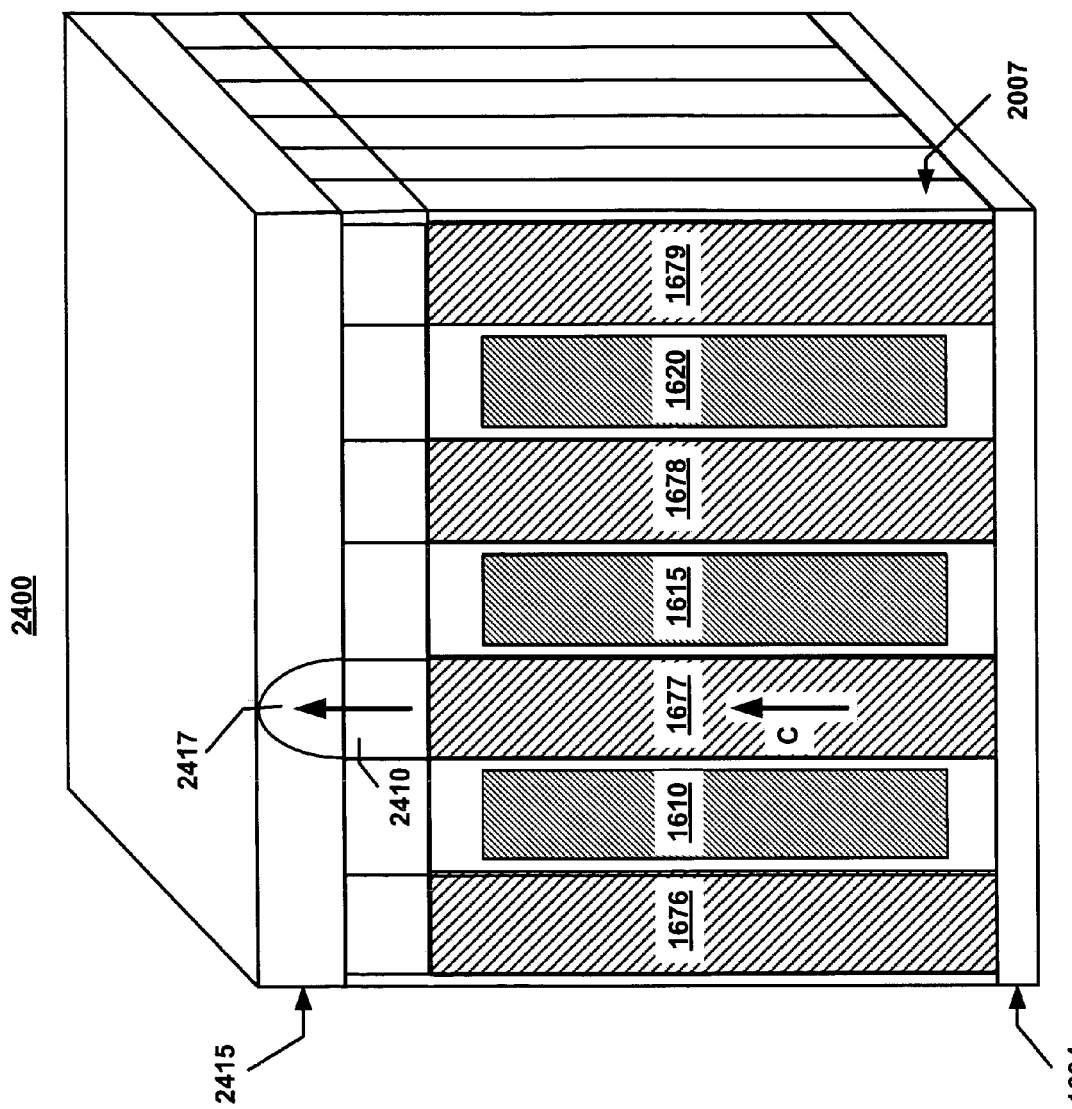
FIG. 24 illustrates a phase change 3D memory array according to the present invention.

FIG. 24 illustrates a phase change 3D memory array 2400 according to the present invention. Memory array 2400 is generally similar to memory array 2300, and includes a plurality of semiconducting nano-pillars 1676, 1677, 1678, 1679 that are separated with a plurality of insulting intermediate regions 1610, 1615, 1620 that are composed, for example, of nitride, oxide, high-K, low-K dielectrics, doped polysilicon or combinations of these and other similar materials.

The application of a potential across the side control electrodes (not shown) enables the selection of a specific nano-pillar, as explained earlier. A heater, such as heater 2410, is formed on top of each one of the nano-pillars 1676, 1677, 1678, 1679, for example nano-pillar 1677. The heater 2410 is formed for example, of Tungsten.

A top layer of phase change material 2415 is formed atop the heaters 2410. The phase change layer 2415 is composed, for example, of GeSbTe or GeSb. Upon the application of a suitable voltage across the side (control) electrodes, one or more nano-pillars 1676, 1677, 1678, 1679 can be selected, causing the electric current to flow through the selected nano-pillar 1677, and to change the phase of a corresponding cell or region 2417 of the phase change layer 2415 to change, for example from amorphous to crystalline or vice versa.

Figure 25:
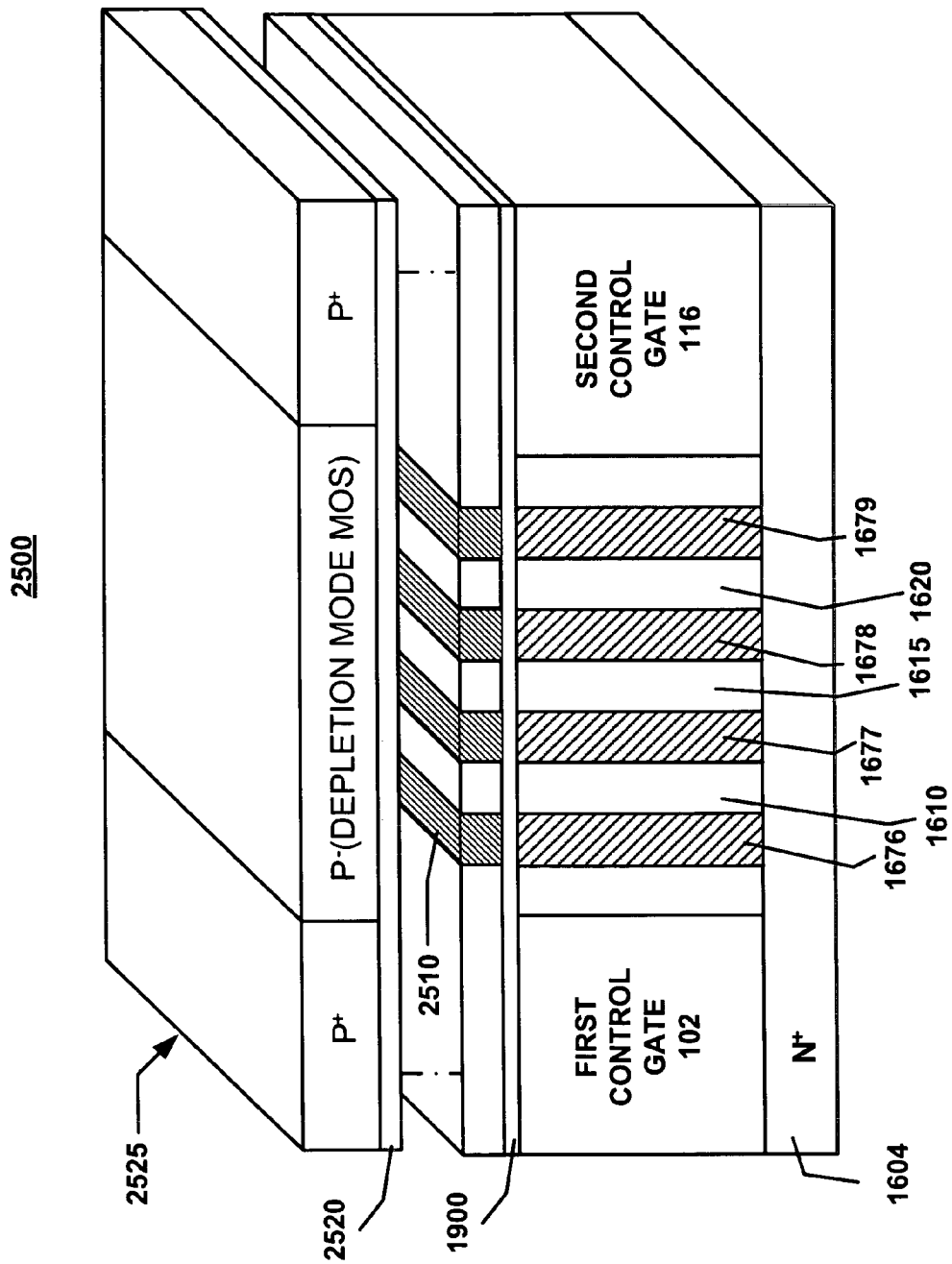
FIG. 25 illustrates a floating gate NAND FLASH according to the present invention.

FIG. 25 illustrates a floating gate NAND FLASH 2500 according to the present invention. The first and second control gates 102, 116 are used to select one or more nano-pillars 1676, 1677, 1678, 1679 as described earlier. An insulation layer 1900 is formed atop the nano-pillars 1676, 1677, 1678, 1679. A floating gate, such as floating gate 2510, is formed on the insulation layer 1900, in alignment with a corresponding nano-pillar, which, in this example, is nano-pillar 1676. The floating gate 2510 can be made, for example, of polysilicon, polygermanium, metal, or any other similar material. The selection of nano-pillar 1676 allows the floating gate 2510 to be accessed and programmed.

A dielectric layer 2520, such as an ONO (oxide nitride oxide) stack, is formed atop the floating gates 2510. The dielectric layer 2520 is shown in FIG. 25 as being separated from the bottom structure for clarity purpose only.

A depletion mode MOS device 2525 is formed atop the dielectric layer 2520. In this example, a p-channel device is shown. A charge placed on the floating gate 2510 alters the threshold voltage of the depletion mode MOS device 2525, but only locally under the influence of the floating gate 2510.

Figure 26:
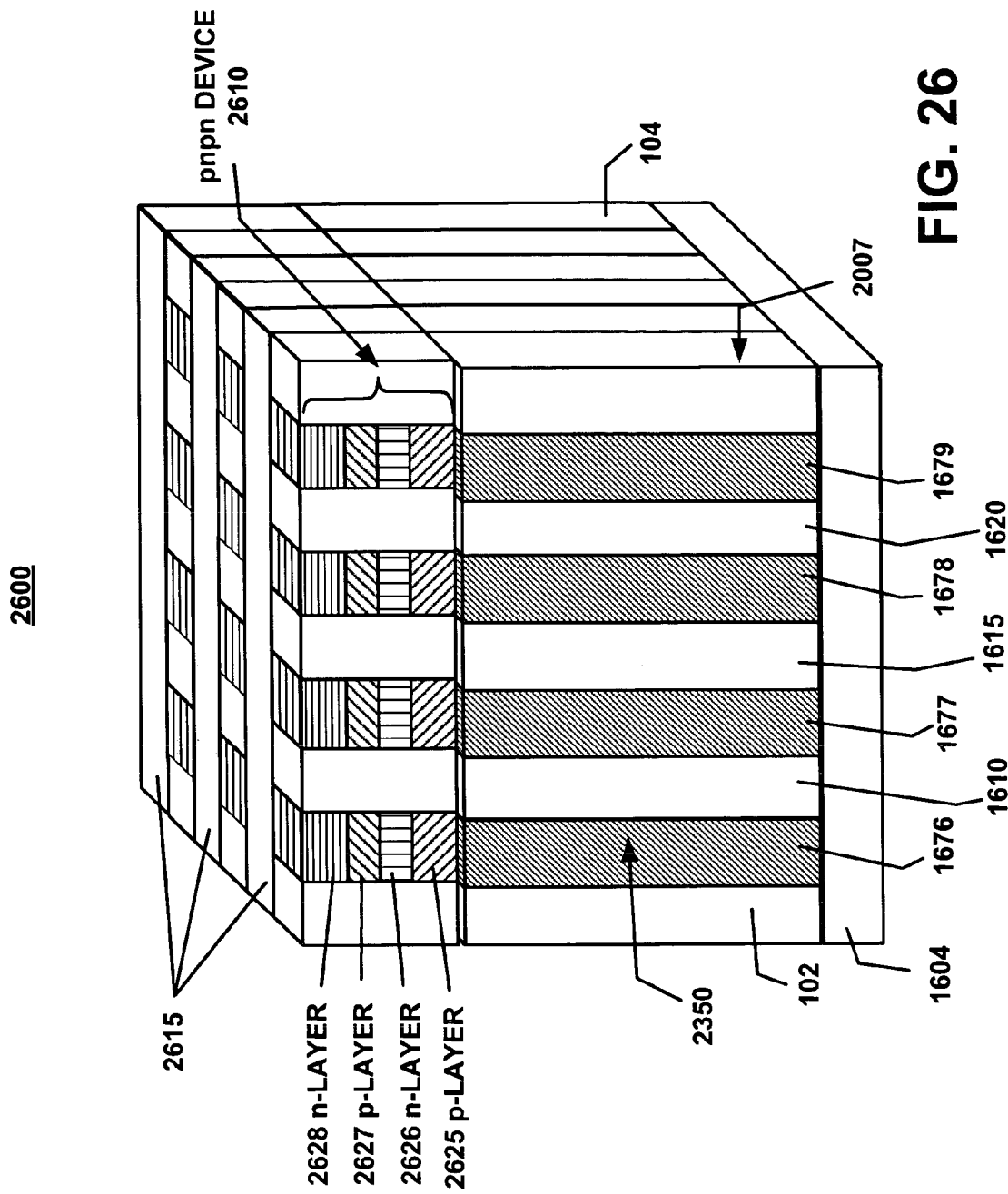
FIG. 26 illustrates an exemplary thyristor according to the present invention.

FIG. 26 illustrates an exemplary thyristor 2600 according to the present invention. The thyristor 2600 includes a pnpn device 2610 that has negative differential resistance (or negative resistance) properties. By using the bistable states associated with the pnpn device 2610, a memory element could be created. While a pnpn device 2610 has been illustrated for exemplary purpose only, it should be clear any negative resistance device, such as a resonant-tunneling, or a Metal-insulator-p-n (MISS) could be designed using the teaching of this embodiment.

The thyristor 2600 includes an array of memory stacks 2007 as explained earlier in connection with FIG. 23. An array of pnpn devices 2610 is formed atop the array of memory stacks 2007, in such a way that each memory it 2350 is aligned with, and corresponds to a pnpn device 2610. A plurality of insulation (e.g., oxide) layers 2615 separate and insulate the pnpn devices 2610.

Considering now an exemplary pnpn device 2610, it is formed of four superimposed layers: a p-layer 2625, a n-layer 2626, a p-layer 2627, and a n-layer 2628. In a preferred embodiment, the doping of the end layers can be maximized relative to the ones in the center. In addition, the center layers (the thyristor bases) could have some species to control the temperature stability.

Figure 27:
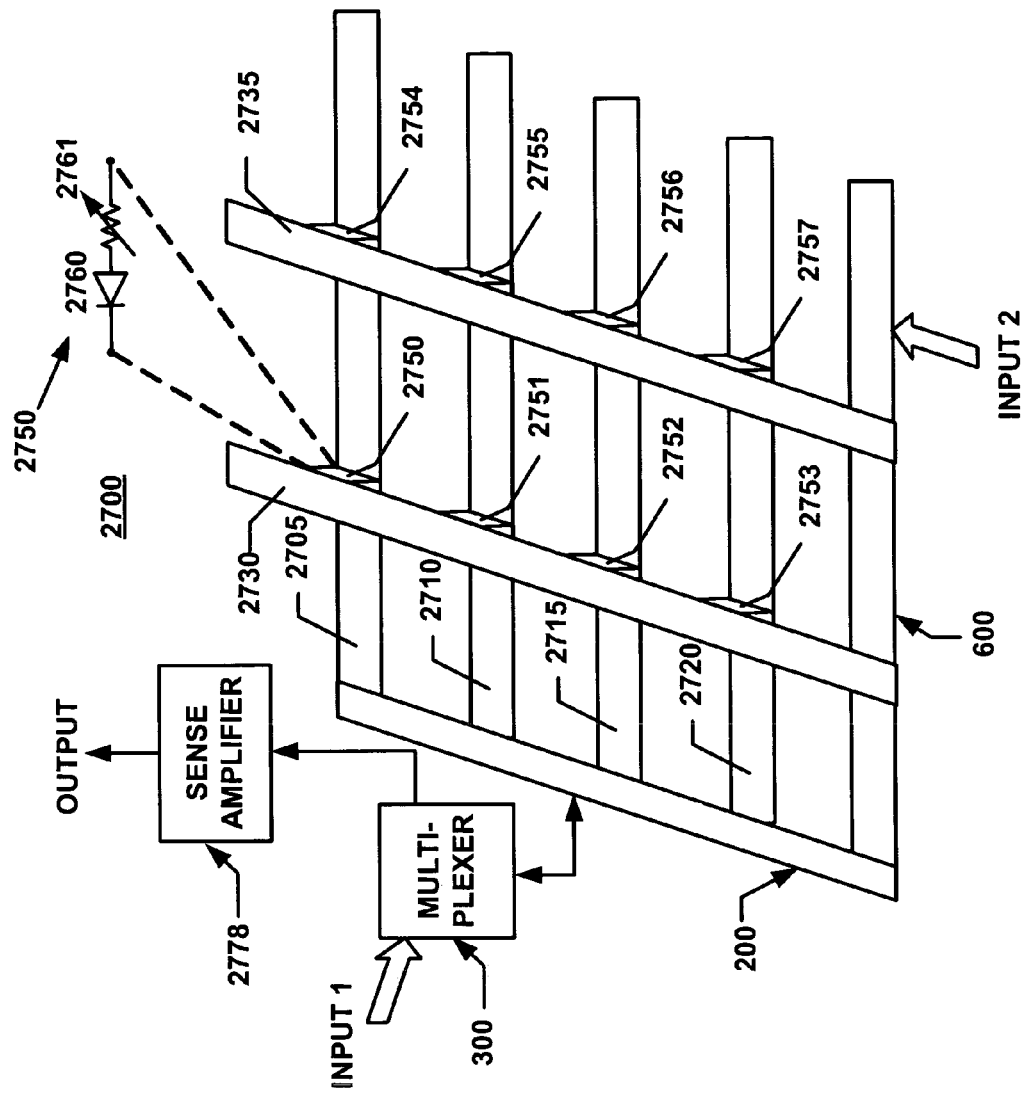
FIG. 27A illustrates an exemplary multi-node block using two multiplexing devices.
FIG. 27B illustrates an array of blocks of FIG. 27A.

FIG. 27A illustrates an exemplary multi-node array 2700 using two (similar or different) multiplexing devices, such as 200 and 600 (or another multiplexing device described herein). The array 2700 includes a plurality of lines such as 2705, 2710, 2715, 2720, 2730, 2735, which are arranged at an angle relative to each other. The angular disposition of these lines is not limited to 90 degrees, as shown in FIG. 27A and the number of lines can vary with the desired application. A plurality of operational devices 2750, 2751, 2752, 2753, 2754, 2755, 2756, 2757 are interposed between two cross lines. As an example, operational device 2750 is interposed between, and at the intersection (or node) of lines 2705 and 2730.

The operational devices could be, for example, memory cells, logic devices, current or voltage emitters or light emitters, or any other device that requires addressing or selective accessibility. Considering now an exemplary operational device 2750, it could represent a switchable element that is responsive to phase change, change of resistance or magneto-resistance, change responsive to a magnetic domain switching, change in electrical polarization, etc. In this example, the operational device 2750 is comprised of a diode 2760 disposed in series with a variable resistance 2761, to control the flow of current between the lines 2730 and 2705, and to selectively establish an electrical path therebetween.

An exemplary operation of array 2700 includes the following steps. As a first step, an appropriate potential is applied between the control electrodes or gates 102, 116 of multiplexing device 200 in order to undeplete, that is to render conductive, the scanning region 106 (FIG. 3). This will cause all the word lines 2705, 2710, 2715, 2720 to be shorted and connected to the same potential. Also, the control electrodes or gates 102, 116 of multiplexing device 600 are set to appropriate potentials that would cause all the bitlines 2730 and 2735 to be connected to the same potential.

The inputs to the multiplexing devices 200, 600 of FIG. 27A are labeled Input 1 and Input 2. These inputs are applied to the electrodes 228 of the multiplexing devices 200, 600, either directly, or via a multiplexer or a multiplexing device, e.g., 300, as described herein. Multiplexing device 300 enables the selection between Input 1 and the output.

As a second step, and with the multiplexing devices 200, 600 still in the undepleted state as described earlier, low or zero potentials, Vref1 and Vref2 are applied to Inputs 1 and 2, respectively, so that all the word lines 2705, 2710, 2715, 2720 are at potential Vref1 and all the bit lines 2730, 2735 are at potential Vref2. These potentials Vref1 and Vref2 are sufficiently low so that they do not cause any of the operational devices 2750, 2751, 2752, 2753, 2754, 2755, 2756, 2757 to switch state, resistance or change phase. This is referred to herein as the resting (or quiescent) state of the device (or block) 2700.

The following example is used solely for the purpose of providing an illustration of the operation of the device 270 and is not intended to be restrictive but rather explanatory. As a third step, a suitable selection potential V1 is applied between the control electrodes or gates 102, 116 of multiplexing device 200 so as to select the word line 2705. Similarly, a suitable selection potential V2 is applied between the control electrodes or gates 102, 116 of multiplexing device 600 so as to select the bit line 2730. As a result, operational device 2750 is selected.

As a fourth step, and once operational device 2750 is selected, two input switching potentials are applied to Inputs 1 and 2. The switching potentials exceed the threshold potentials of element 2750, and are sufficiently high to selectively program the state, resistance or change the phase of the selected operational device 2750.

The foregoing four steps are repeated for each cell (node or operational device) of device (or block) 2700, so that all the cells are programmed as desired. If an array 2777 of devices or blocks 2700 (FIG. 27B) is used, each block 2700 is programmed individually as described earlier. In addition, numerous blocks 2700 of array 2777 could be programmed and accessed concurrently.

Once the operational devices 2750-2757 are programmed, array 2700 could be used to selectively read any one or more of the operational devices 2750-2757 according to the following steps. As a first step, an appropriate potential is applied between the control electrodes or gates 102, 116 of multiplexing device 200 in order to undeplete the scanning region 106 (FIG. 3). This will cause all the word lines 2705, 2710, 2715, 2720 to be shorted and connected to the same potential.

As a second step, and with the multiplexing devices 200, 600 still in the undepleted state as described earlier, low or zero potentials, Vref1 and Vref2 are applied to Inputs 1 and 2, respectively, so that all the word lines 2705, 2710, 2715, 2720 are at potential Vref1 and all the bit lines 2730, 2735 are at potential Vref2. These potentials Vref1 and Vref2 are sufficiently low so that they do not cause any of the operational devices 2750, 2751, 2752, 2753, 2754, 2755, 2756, 2757 to switch state or resistance or phase.

The following example is used solely for the purpose of providing an illustration of the operation of the device 270 and is not intended to be restrictive but rather explanatory. As a third step, a suitable selection potential V1 is applied between the control electrodes or gates 102, 116 of multiplexing device 200 so as to select the word line 2705. Similarly, a suitable selection potential V2 is applied between the control electrodes or gates 102, 116 of multiplexing device 600 so as to select the bit line 2730. As a result, operational device 2750 is selected.

As a fourth step, and once operational device 2750 is selected, two input reading potentials are applied to Inputs 1 and 2. The reading potentials are less than the threshold potentials, and are sufficiently low to selectively read the state or phase of the selected operational device 2750, but not to reprogram it. After applying a potential to 2730, the bitline is kept floating so that its potential may be changed due to the element.

In the example of FIG. 27A, and depending on the state or phase of resistor 2761, the potential across the operational device 2750 will either rise or remain substantially constant. More specifically, if the resistor 2761 is in a high resistive state, then the potential across the operational device 2750 will remain essentially constant. Otherwise, the potential will rise significantly to reflect the state or phase of the operational device (or cell) 2750. A sense amplifier 2778 is attached to the output of multiplexing device 300 to amplify the current flowing through the operational device 2750.

In another operation of array 2700, multiplexing devices 200 and 600 are used to program the states of the operational devices of array 2700, simulating the operation of a programmable logic array.

Array 2700 could be used in a variety of applications. One such application includes a scanner wherein the vertical lines 2730, 2735 are scanned, one line at a time, to read the outputs along lines 2705, 2710, 2715, and 2720. Though only two vertical lines 2730, 2735 and four horizontal lines 2705-2720 are illustrated, it should be clear that many additional lines could alternatively be used.

Figure 28:
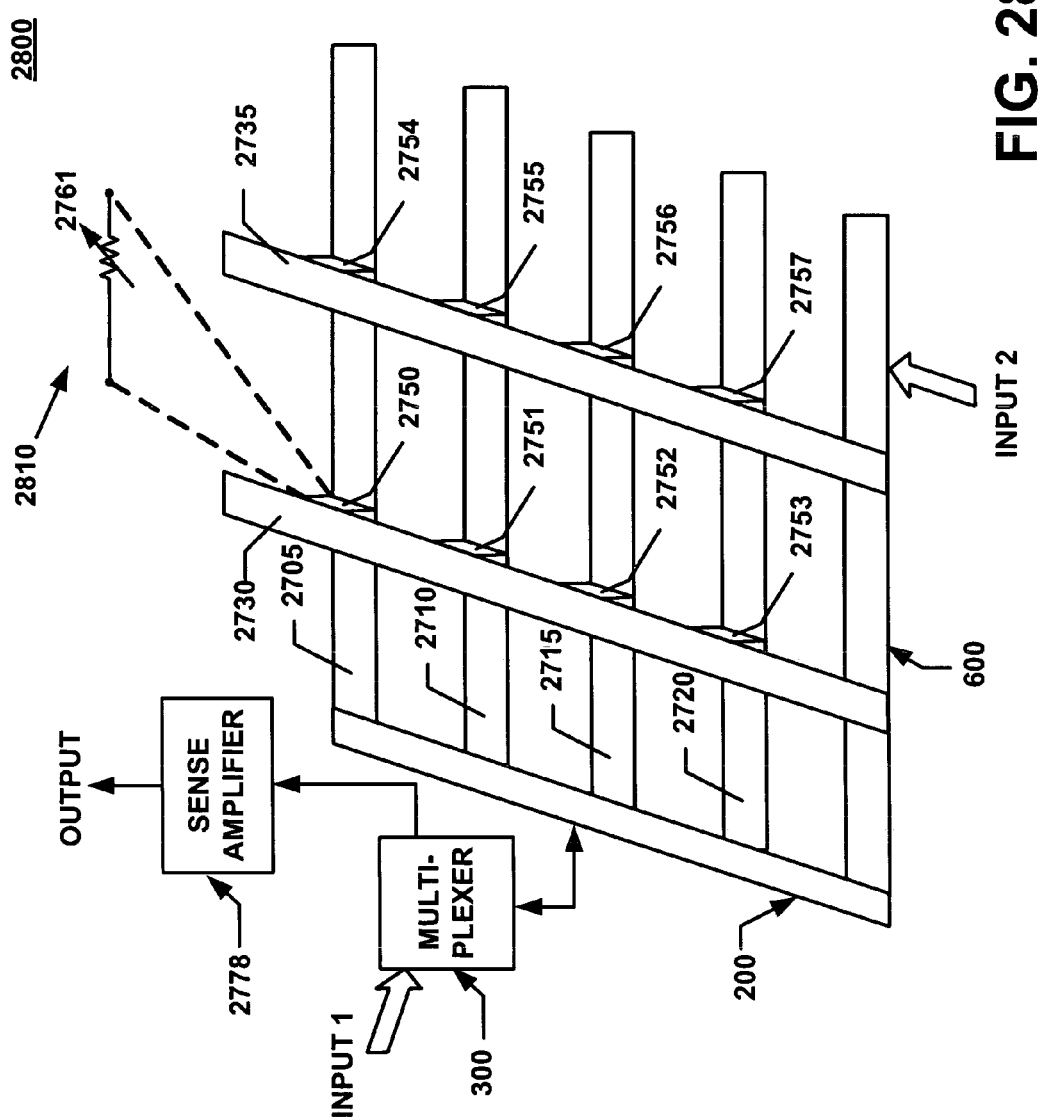
FIG. 28 illustrates another exemplary multi-node block that is generally similar to the multi-node block of FIG. 27A.

FIG. 28 illustrates another exemplary multi-node array 2800 that is generally similar to the multi-node array 2700 of FIG. 27A, showing the use of an operational device 2810 that is comprised of a variable resistor 2761, with rectifying properties that preclude the need for a separate diode.

Figure 29:
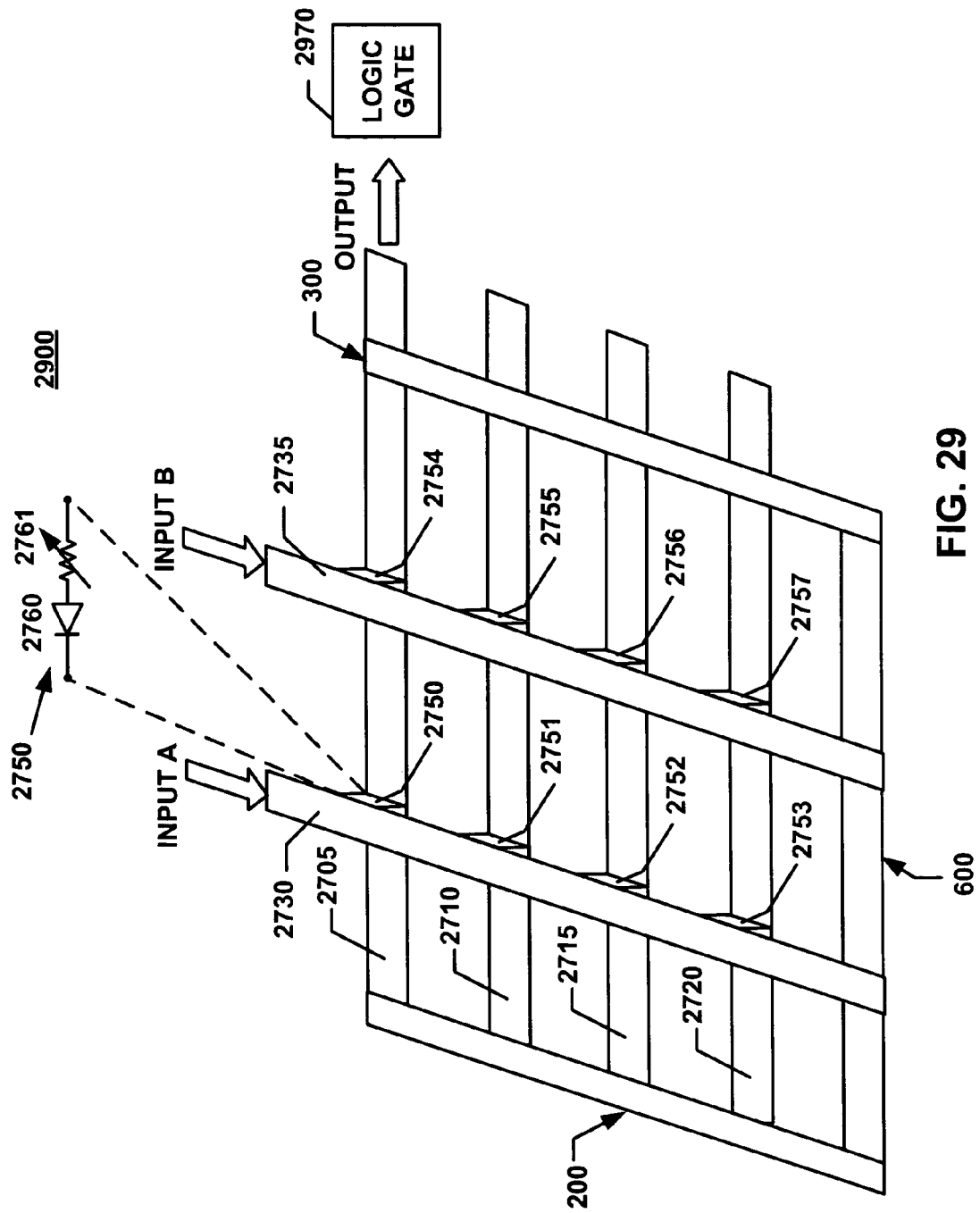
FIG. 29 illustrates yet another exemplary multi-node block that is generally similar to the multi-node block of FIG. 27A.

FIG. 29 illustrates yet another exemplary multi-node array 2900 that is generally similar to the multi-node array 2700 of FIG. 27A, showing the use of the array 2900 as a programmable logic array used to drive output devices, such as a logic gate 2970. Array 2900 further may include a third multiplexing device 300 that controls the selection of the output of array 2900. For example, in this example, multiplexing device 300 selects one or more lines 2705, 2710, 2715, 2720 for outputting the result of the programmable logic array.

To this end, the operational devices 2750-2757 can be independently programmed using the multiplexing devices 200, 600, as explained earlier. Multiplexing devices 200, 600 are fully depleted, and Inputs A and B are applied to lines 2730, 2735. Multiplexing device 300 is used to select the desired line to output the result of the programmable logic operation, for driving the output device, such as logic gate 2970.

It is to be understood that the specific embodiments of the present invention that have been described are merely illustrative of certain applications of the principle of the memory devices. Numerous modifications may be made to the memory devices without departing from the spirit and scope of the present invention.

What is claimed is:

1. A selectively accessible device comprising:
   an electronically scannable multirlexinp device that includes:
   a plurality of selectable outputs;
   a scanning region a gate disposed at an end of the scanning region;
   wherein upon application of a potential to the scanning region, a depletion region is positioned within the scanning region to generate a conducting channel within the scanning region, wherein the conducting channel selectively connects at least one of a plurality of outputs to an input electrode of the multiplexing device;
   wherein a location of the conducting channel is selectively positioned within the scanning region by varying the potential; and
   an operational device that is electrically connected to the multiplexing device, so that the operational device is selected by selecting the position of the conducting channel within the scanning region.

2. The device of claim 1, wherein the electronically scannable multiplexing device further comprises an additional gate that is disposed at an opposite end of the scanning region relative to the gate.

3. The device of claim 1, wherein the gate is formed of any one or more of a conductive material and a semiconductive material.

4. The device of claim 1, wherein the gate forms a p-n junction with the scanning region.

5. The device of claim 1, wherein the conducting channel selectively connects the at least one of the outputs to at least one of a plurality of input lines.

6. The device of claim 1, wherein the operational device includes at least one or more of:
   a memory device; and
   a logic device.

7. The device of claim 6, wherein the memory device comprises an insulator layer that is contiguously disposed relative to an electrode.

8. The device of claim 7, wherein the memory device further comprises a conducting layer that is disposed between the insulator layer and the electrode.

9. The device of claim 6, wherein the memory device comprises a memory element that is contiguously disposed relative to an electrode.

10. The device of claim 6, wherein the memory device comprises two end insulation layers; a plurality of memory cells that are disposed between the end insulation layers; and a plurality of intermediate insulation layers that are disposed between the memory cells.

11. The device of claim 10, wherein each memory cell comprises an electrically conductive layer that is contiguously disposed relative to a memory element.

12. The device of claim 6, wherein the memory cell and the multiplexing device are integrally formed.

13. The device of claim 12, wherein each memory cell forms a phase change stack.

14. The device of claim 13, wherein each phase change stack comprises at least one heater element that is contiguously disposed relative to a phase change element.

15. The device of claim 6, wherein the memory device comprises an array of PROM cells.

16. The device of claim 6, wherein the memory device comprises a NAND flash.

17. The device of claim 16, wherein the logic device and the multiplexing device are integrally formed.

18. The device of claim 1, wherein the operational device comprises a thyristor.

* * * * *

UNITED STATES PATENT AND TRADEMARK OFFICE
CERTIFICATE OF CORRECTION

PATENT NO.         : 7,385,234 B2
APPLICATION NO.    : 11/116700
DATED              : June 10, 2008
INVENTOR(S)        : Kailash Gopalakrishnan et al.

Page 1 of 1

It is certified that error appears in the above-identified patent and that said Letters Patent is hereby corrected as shown below:

Please make the following changes:

Col. 19 Claim 1, line 25, from "multirlexinp" to -- multiplexing --
Col. 19 Claim 1, line 28, from "a scanning region a gate disposed at an end of the scanning region"
to -- a scanning region; --
-- a gate disposed at an end of the scanning region --

Signed and Sealed this

Seventh Day of October, 2008

JON W. DUDAS
*Director of the United States Patent and Trademark Office*